United States Patent
Yokoi et al.

(10) Patent No.: US 10,307,866 B2
(45) Date of Patent: *Jun. 4, 2019

(54) METHOD OF PRODUCING SEMICONDUCTOR CHIP, AND MASK-INTEGRATED SURFACE PROTECTIVE TAPE USED THEREIN

(71) Applicant: FURUKAWA ELECTRIC CO., LTD., Tokyo (JP)

(72) Inventors: Hirotoki Yokoi, Tokyo (JP); Tomoaki Uchiyama, Tokyo (JP); Yoshifumi Oka, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/868,866

(22) Filed: Jan. 11, 2018

(65) Prior Publication Data

US 2018/0185964 A1 Jul. 5, 2018

Related U.S. Application Data

(63) Continuation of application No. PCT/JP2016/082983, filed on Nov. 7, 2016.

(30) Foreign Application Priority Data

Nov. 9, 2015 (JP) .................................. 2015-219736
Nov. 9, 2015 (JP) .................................. 2015-219738

(51) Int. Cl.
*B23K 26/351* (2014.01)
*B23K 26/352* (2014.01)
(Continued)

(52) U.S. Cl.
CPC .......... *B23K 26/351* (2015.10); *B23K 26/362* (2013.01); *C09J 7/20* (2018.01);
(Continued)

(58) Field of Classification Search
CPC .......... C09J 201/00; C09J 7/20; H01L 21/304; H01L 21/6836; H01L 21/78;
(Continued)

(56) References Cited

U.S. PATENT DOCUMENTS 5,983,829 A * 11/1999 Suzuki .............. H01J 37/32192
118/723 MA
6,110,287 A * 8/2000 Arai ..................... C23C 16/5096
118/723 E (Continued)

FOREIGN PATENT DOCUMENTS

JP 2006-114825 A 4/2006
JP 2007-19385 A 1/2007
(Continued)

OTHER PUBLICATIONS

International Search Report for PCT/JP2016/082983 (PCT/ISA/210) dated Dec. 27, 2016.
(Continued)

*Primary Examiner* — Eric S Stapleton
(74) *Attorney, Agent, or Firm* — Birch, Stewart, Kolasch & Birch, LLP

(57) ABSTRACT

A method of producing a semiconductor chip, including the following steps (a) to (d):
(a) a step of, in the state of having laminated a mask-integrated surface protective tape on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;
(Continued)

(b) a step of, after peeling the surface protective tape thereby to expose the mask material layer on top, forming an opening of a street of the semiconductor wafer;

(c) a plasma dicing step of segmentalizing the semiconductor wafer by a plasma irradiation to singulate it into semiconductor chips; and (d) an ashing step of removing the mask material layer by the plasma irradiation.

10 Claims, 6 Drawing Sheets

(51) Int. Cl.
| | | |
|---|---|---|
| C09J 201/00 | (2006.01) | |
| C09J 7/20 | (2018.01) | |
| H01L 21/304 | (2006.01) | |
| B23K 26/362 | (2014.01) | |
| H01L 21/78 | (2006.01) | |
| H01L 21/683 | (2006.01) | |
| H01L 21/308 | (2006.01) | |

(52) U.S. Cl.
CPC .......... *C09J 201/00* (2013.01); *H01L 21/304* (2013.01); *H01L 21/3081* (2013.01); *H01L 21/6836* (2013.01); *H01L 21/78* (2013.01); *H01L 2221/6834* (2013.01); *H01L 2221/68327* (2013.01); *H01L 2221/68381* (2013.01)

(58) Field of Classification Search
CPC .. H01L 2221/6834; H01L 2221/68381; B23K 26/351
USPC .................................................. 219/121.69
See application file for complete search history.

(56) References Cited

U.S. PATENT DOCUMENTS

| | | | | |
|---|---|---|---|---|
| 6,406,979 B2* | 6/2002 | Fischer | ............... | H01L 21/3043 257/E21.238 |
| 6,582,983 B1* | 6/2003 | Runyon | ............... | H01L 21/6835 257/E23.02 |
| 6,642,127 B2* | 11/2003 | Kumar | ................ | H01L 21/304 257/E21.237 |
| 6,676,878 B2* | 1/2004 | O'Brien | ............... | B23K 26/032 264/400 |
| 6,696,669 B2* | 2/2004 | Hembree | ................ | H01L 21/50 174/536 |
| 6,706,998 B2* | 3/2004 | Cutler | .................... | B23K 26/08 219/121.72 |
| 6,726,804 B2* | 4/2004 | Wang | .................... | C23C 16/507 118/723 E |
| 6,759,275 B1* | 7/2004 | Lee | ..................... | H01L 21/6835 257/E21.599 |
| 6,790,684 B2* | 9/2004 | Ahn | ...................... | H01L 23/481 257/E21.705 |
| 6,803,247 B2* | 10/2004 | Sekiya | ............... | H01L 21/67092 257/E21.599 |
| 6,887,804 B2* | 5/2005 | Sun | ........................ | B23K 26/04 219/121.6 |
| 6,998,571 B2* | 2/2006 | Sekiya | ............... | B23K 26/0853 219/121.67 |
| 7,128,806 B2* | 10/2006 | Nguyen | ................ | H01J 37/321 156/345.51 |
| 7,129,150 B2* | 10/2006 | Kawai | .................. | B28D 5/0011 438/463 |
| 7,150,796 B2* | 12/2006 | Smith | .................. | C23C 16/4405 134/18 |
| 7,166,536 B1* | 1/2007 | Laermer | ............. | H01L 21/3065 257/E21.218 |
| 7,179,723 B2* | 2/2007 | Genda | .................... | B23K 26/18 257/E21.599 |
| 7,183,137 B2* | 2/2007 | Lee | ......................... | B28D 5/00 257/E21.599 |
| 7,265,033 B2* | 9/2007 | Shigematsu | ........... | B23K 26/04 219/121.69 |
| 7,361,990 B2* | 4/2008 | Lu | ....................... | H01L 23/3114 257/738 |
| 7,364,986 B2* | 4/2008 | Nagai | .................... | B23K 26/08 438/463 |
| 7,435,607 B2* | 10/2008 | Nagai | ................. | H01L 21/6835 438/33 |
| 7,459,377 B2* | 12/2008 | Ueda | ...................... | B82Y 20/00 257/E21.238 |
| 7,468,309 B2* | 12/2008 | Shigematsu | ........ | H01L 21/6835 257/E21.599 |
| 7,473,866 B2* | 1/2009 | Morishige | ........... | B23K 26/0613 219/121.76 |
| 7,507,638 B2* | 3/2009 | Mancini | ............... | H01L 21/3065 257/E21.214 |
| 7,507,639 B2* | 3/2009 | Nakamura | ........... | B28D 5/0011 438/463 |
| 7,629,228 B2* | 12/2009 | Haji | ...................... | H01L 21/6835 438/14 |
| 7,678,670 B2* | 3/2010 | Arita | .................... | H01L 21/6835 257/E21.523 |
| 7,687,740 B2* | 3/2010 | Bruland | ............. | B23K 26/0613 219/121.67 |
| 7,754,584 B2* | 7/2010 | Kumakawa | ......... | B81C 1/00873 438/463 |
| 7,767,551 B2* | 8/2010 | Arita | ...................... | H01L 21/78 438/460 |
| 7,767,554 B2* | 8/2010 | Arita | .................... | H01L 21/3043 257/E21.238 |
| 7,776,720 B2* | 8/2010 | Boyle | .................. | B23K 26/0648 438/463 |
| 7,804,043 B2* | 9/2010 | Deshi | ...................... | B23K 26/40 219/121.67 |
| 7,838,323 B2* | 11/2010 | Utsumi | ............... | B81C 1/00896 438/53 |
| 7,859,084 B2* | 12/2010 | Utsumi | ................ | B28D 5/0011 257/620 |
| 7,875,898 B2* | 1/2011 | Maeda | ................ | H01L 33/0095 257/99 |
| 7,906,410 B2* | 3/2011 | Arita | ...................... | H01L 21/78 438/460 |
| 7,923,351 B2* | 4/2011 | Arita | ...................... | H01L 21/78 257/E21.602 |
| 7,926,410 B2* | 4/2011 | Bair | ........................ | F15B 11/22 60/484 |
| 7,927,973 B2* | 4/2011 | Haji | ........................ | H01L 21/78 257/E21.599 |
| 9,142,459 B1* | 9/2015 | Kumar | ................ | H01L 21/0337 |
| 9,601,375 B2* | 3/2017 | Lei | ......................... | H01L 21/78 |
| 2002/0066537 A1* | 6/2002 | Ogino | ............... | H01J 37/32192 156/345.44 |
| 2003/0162313 A1* | 8/2003 | Kim | ..................... | H01L 21/6835 438/33 |
| 2004/0080045 A1* | 4/2004 | Kimura | ............... | H01L 21/76898 257/736 |
| 2004/0102025 A1* | 5/2004 | Arita | ................... | H01J 37/32082 438/460 |
| 2004/0137700 A1* | 7/2004 | Sekiya | ................ | B28D 5/0064 438/460 |
| 2004/0157457 A1* | 8/2004 | Xu | ..................... | H01L 21/28114 438/694 |
| 2004/0212047 A1* | 10/2004 | Joshi | ..................... | H01L 23/585 257/620 |
| 2005/0029221 A1* | 2/2005 | Chang | ................ | B81C 1/00619 216/2 |
| 2006/0009008 A1* | 1/2006 | Kaneuchi | ............. | B23K 26/03 438/463 |
| 2006/0024924 A1* | 2/2006 | Haji | ................... | H01L 21/6835 438/464 |
| 2006/0043535 A1* | 3/2006 | Hiatt | ................. | H01L 21/76898 257/621 |

(56) References Cited

U.S. PATENT DOCUMENTS

| | | | | |
|---|---|---|---|---|
| 2006/0086898 | A1* | 4/2006 | Cheng | G03F 7/70275 |
| | | | | 250/236 |
| 2006/0088984 | A1* | 4/2006 | Li | B23K 26/38 |
| | | | | 438/463 |
| 2006/0146910 | A1* | 7/2006 | Koochesfahani | G01K 11/20 |
| | | | | 374/161 |
| 2006/0205182 | A1* | 9/2006 | Soejima | H01L 21/78 |
| | | | | 438/460 |
| 2006/0281226 | A1* | 12/2006 | Nakamura | B28D 5/0011 |
| | | | | 438/113 |
| 2009/0255911 | A1* | 10/2009 | Krishnaswami | B23K 26/067 |
| | | | | 219/121.69 |
| 2010/0013036 | A1* | 1/2010 | Carey | H01L 21/268 |
| | | | | 257/431 |
| 2010/0022071 | A1* | 1/2010 | Arita | H01L 21/3043 |
| | | | | 438/463 |
| 2010/0048001 | A1* | 2/2010 | Harikai | H01J 37/32743 |
| | | | | 438/464 |
| 2010/0078800 | A1* | 4/2010 | Aboush | H01L 23/3128 |
| | | | | 257/692 |
| 2010/0120230 | A1* | 5/2010 | Grivna | H01L 21/78 |
| | | | | 438/464 |
| 2010/0173474 | A1* | 7/2010 | Arita | H01L 21/78 |
| | | | | 438/462 |
| 2010/0216313 | A1* | 8/2010 | Iwai | H01J 37/32623 |
| | | | | 438/729 |
| 2010/0248451 | A1* | 9/2010 | Pirogovsky | B23K 26/38 |
| | | | | 438/463 |
| 2011/0312157 | A1* | 12/2011 | Lei | H01L 21/78 |
| | | | | 438/462 |
| 2012/0238073 | A1* | 9/2012 | Johnson | H01L 21/3065 |
| | | | | 438/464 |
| 2012/0322234 | A1* | 12/2012 | Yalamanchili | H01L 21/30655 |
| | | | | 438/462 |
| 2013/0045554 | A1* | 2/2013 | Yamazaki | H01L 27/1214 |
| | | | | 438/34 |
| 2013/0065378 | A1* | 3/2013 | Johnson | H01L 21/3065 |
| | | | | 438/460 |
| 2014/0004685 | A1* | 1/2014 | Chowdhury | H01L 21/78 |
| | | | | 438/463 |
| 2014/0295644 | A1* | 10/2014 | Harikai | H01L 21/78 |
| | | | | 438/464 |
| 2016/0042996 | A1* | 2/2016 | Yakoo | H01L 21/78 |
| | | | | 438/462 |
| 2018/0012787 | A1* | 1/2018 | Oka | H01L 21/302 |
| 2018/0158691 | A1* | 6/2018 | Yokoi | H01L 21/304 |
| 2018/0185964 | A1* | 7/2018 | Yokoi | C09J 201/00 |
| 2018/0226359 | A1* | 8/2018 | Yokoi | C09J 4/00 |

FOREIGN PATENT DOCUMENTS

| | | |
|---|---|---|
| JP | 2008-193034 A | 8/2008 |
| JP | 2008-226940 A | 9/2008 |
| JP | 2009-33087 A | 2/2009 |
| JP | 2009-141024 A | 6/2009 |
| JP | 2010-165963 A | 7/2010 |
| JP | 2015-18809 A | 10/2015 |

OTHER PUBLICATIONS

Written Opinion of the International Searching Authority for PCT/JP2016/082983 (PCT/ISA/237) dated Dec. 27, 2016.

Korean Office Action, dated Jan. 28, 2019, for Korean Application No. 10-2017-7021909, with an English translation.

* cited by examiner

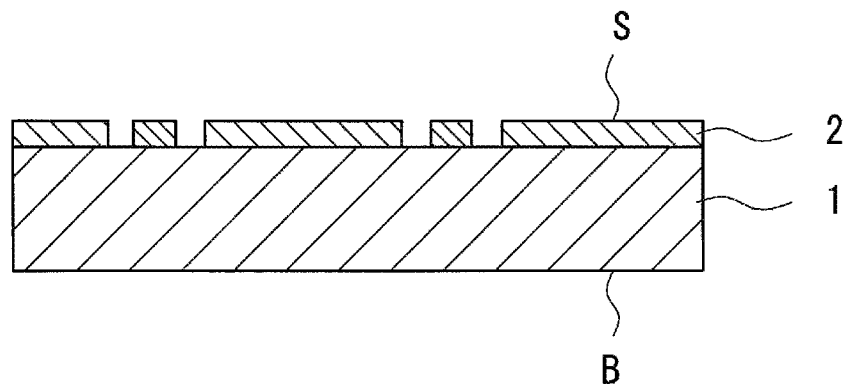
Fig. 1(a)
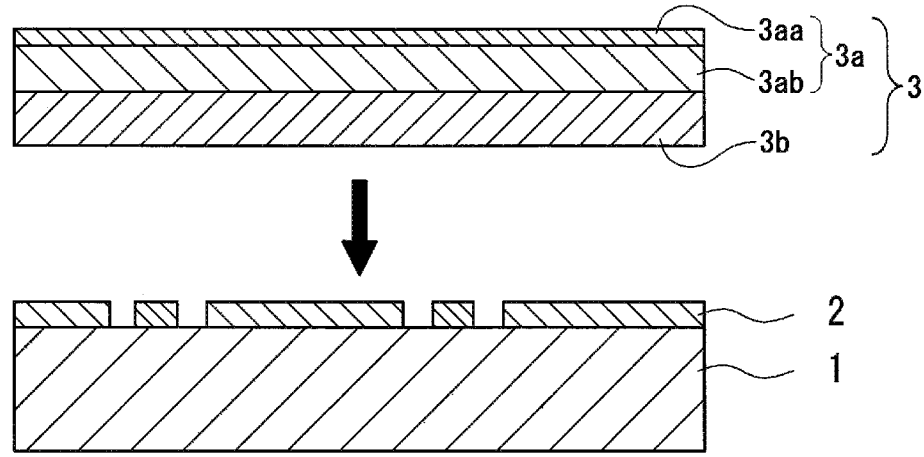
Fig. 1(b)
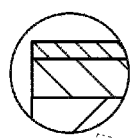
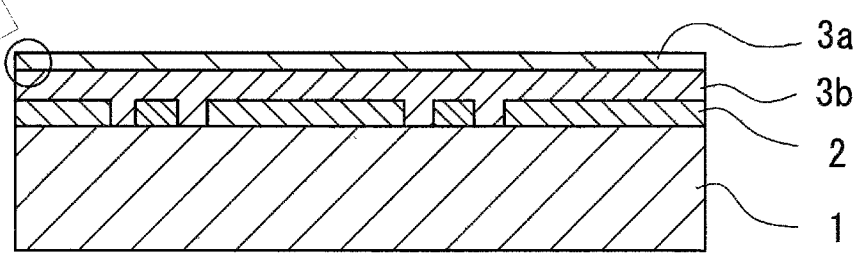
Fig. 1(c)

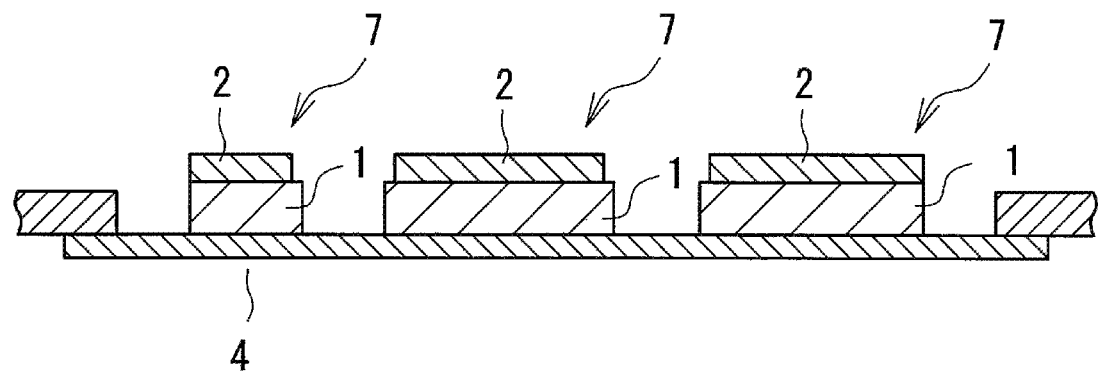
Fig. 5 ( a )
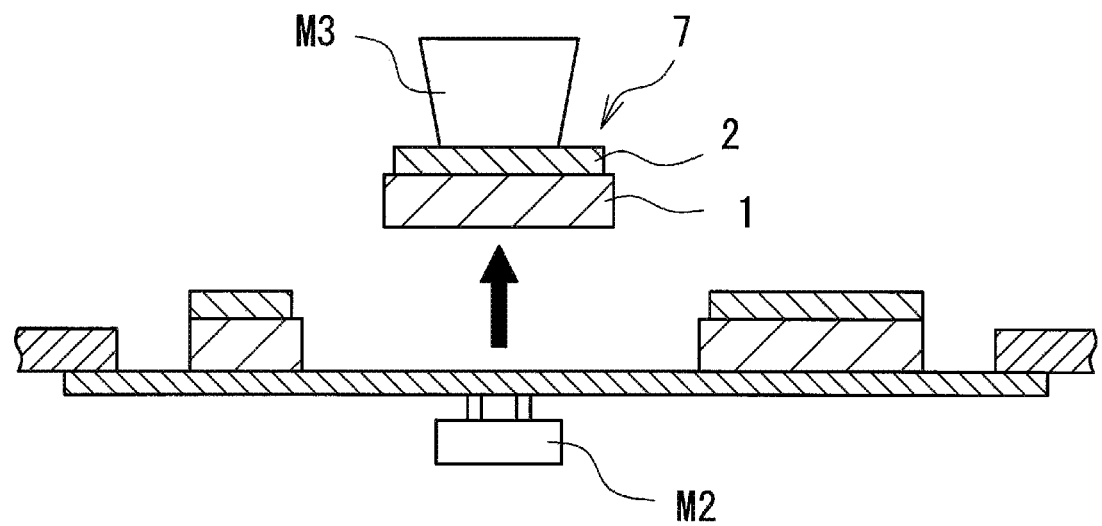
Fig. 5 ( b )

METHOD OF PRODUCING SEMICONDUCTOR CHIP, AND MASK-INTEGRATED SURFACE PROTECTIVE TAPE USED THEREIN

CROSS-REFERENCE TO RELATED APPLICATIONS

This application is a Continuation of PCT International Application No. PCT/JP2016/082983 filed on Nov. 7, 2016, which claims priority under 35 U.S.C. § 119 (a) to Japanese Patent Applications No. 2015-219736 filed in Japan on Nov. 9, 2015 and No. 2015-219738 filed in Japan on Nov. 9, 2015. Each of the above applications is hereby expressly incorporated by reference, in its entirety, into the present application.

TECHNICAL FIELD

The present invention relates to a method of producing a semiconductor chip and a mask-integrated surface protective tape used therein.

BACKGROUND ART

In recent years, remarkable evolution has made on the thinning of the semiconductor chip and the downsizing of the chip. In particular, the thinning is required in the IC cards with built-in semiconductor IC chips, such as a memory card and a smart card. Further, the downsizing of the chip is required in LED or LCD driving devices and the like. With the increase in these demands from now, the needs for the thinning of the semiconductor chip and the downsizing of the chip are thought of as being increased much more.

These semiconductor chips are obtained, by thinning a semiconductor wafer to a predetermined thickness in the backgrinding step, an etching step or the like, and then dividing the semiconductor wafer into individual chips through a dicing step. In this dicing step, a blade dicing method of cutting the semiconductor wafer with a dicing blade has been used. In this blade dicing method, the cutting resistance by the blade is put directly on the semiconductor wafer at the time of cutting, so that a microscopic crack (or chipping) sometimes occurs in the semiconductor chip by this cutting resistance. Occurrence of the chipping does not only deteriorate outer appearance of the semiconductor chip, but also in some cases, there is a risk that even a circuit pattern on the chip is damaged, for example, a damage of chips is occurred due to lack (or insufficiency) of the transverse strength (or deflective strength) at the time of picking up. Further, in the foregoing physical dicing step using such a blade, it is impossible to set the width of a kerf (also referred to as a scribe line or a street) which is an interval between chips to less than the thick blade width. As a result, the number (yield) of chips gotten from a sheet of wafer decreases. Further, a long time period to be taken for the processing of the wafer is also a problem.

In the dicing step, use is also made of any of various kinds of methods, other than the blade dicing method. There is a DBG (i.e. dicing before grinding) method of, in view of the difficulty in carrying out the dicing after the thinning of the wafer, forming in first a groove with a predetermined thickness in the wafer, and then carrying out a grinding step, and thereby for achieving both the thinning and the singulation into chips at the same time. This method has the advantage that although the kerf width is similar to that in the blade dicing method, the transverse strength of the chip is increased, so that a damage of the chip can be suppressed.

Further, there is a laser dicing method of carrying out a dicing step with a laser. The laser dicing method has the advantage that a kerf width can be narrowed and the laser dicing method is a dry process. However, there is a disadvantage that a wafer surface is contaminated with a sublimate at the time of cutting with a laser. For this reason, the wafer surface sometimes necessities being subjected to a pretreatment of protecting it with a predetermined liquid protecting material. Further, the foregoing dry process has not yet led to achievement of a complete dry process. Further, the laser dicing method allows a further speeding-up of the processing rate, compared to the blade dicing method. However, the laser dicing method remains unchanged in carrying out a processing along every one line, and therefore it takes a certain time period for producing an extremely small chip.

In a case of using a wet process, such as a water-jet method of carrying out a dicing step with a water pressure, there is a possibility that a problem occurs in the material which is sensitive to a surface contamination, such as an MEMS device, a CMOS sensor, and the like. There is also a disadvantage that a kerf width cannot be narrowed only to some extent, so that a chip yield is low.

The stealth dicing method of forming a modifying layer with a laser in the thickness direction of the wafer, and then splitting the modifying layer by expansion to singulate the wafer, has the advantage that a kerf width can be reduced to zero and a processing can be carried out in a dry state. However, a transverse strength of the chip tends to be decreased by the thermal history at the time of forming the modifying layer. Further, silicon debris sometimes occurs at the time of splitting the modifying layer by expansion. Further, there is a risk that the collision of each adjacent chips may be bring about short (or insufficiency) of the transverse strength.

Further, as a combined method of the stealth dicing and the dicing before grinding, there is a chip-singulation method corresponding to a narrow scribe width, which forms in first a modifying layer with only a predetermined width prior to the thinning, and then carrying out a grinding step from the backing-face side, thereby for achieving the thinning and the singulation into chips at the same time. This technique improves the disadvantages of the above mentioned process, and has the advantage that a kerf width is zero and a chip yield is high and also a transverse strength is increased, because a silicon modifying layer is cleaved and singulated by a stress in the wafer backgrinding step. However, because singulation is performed in the back-grinding step, a phenomenon is sometimes occurred, in which an end side of the chip collides with an adjacent chip, and thereby that the chip corner is chipped.

Further, a dicing technology by a plasma dicing method has been proposed (for example, see Patent Literature 1). The plasma dicing method is a method of dividing a semiconductor wafer, by selectively etching a portion which is not covered with a mask, using plasma. If this dicing method is used, segmentation of chips can be achieved selectively, and even if the scribe line is curved, the segmentation is possible with no trouble. Further, as the etching rate is very high, in recent years, this dicing method is considered one of the most suitable steps for the segmentation into chips.

CITATION LIST

Patent Literatures

Patent Literature 1: JP-A-2007-19385 ("JP-A" means unexamined published Japanese patent application)

SUMMARY OF INVENTION

Technical Problem

In the plasma dicing method, use is made of, as a plasma generating gas, a fluorine-based gas which has a very high reactivity with a wafer, such as sulfur hexafluoride ($SF_6$) and carbon tetrafluoride ($CF_4$). Therefore the etching rate is high, and a mask protection with respect to the surface not to be etched is necessary.

In order to form the mask, as described in Patent Literature 1, generally the technique is used which consists of: coating a resist on the surface of the wafer; and then removing the portion corresponding to a street by a photolithography, to form the mask. Therefore, in order to carry out the plasma dicing, it is required for a facility for the photolithographic step other than the plasma dicing facility. For this reason, there is a problem of increase in chip costs. Further, because of being in a state that a resist film is remaining after the plasma-etching, it is necessarily to use a large amount of solvent to remove the resist. Further in the case, if the resist is not able to be removed completely, there may be a risk that the remained resist act as an adhesive deposit, which results in occurrence of a defective chip. Further, there is also a disadvantage that an overall processing process gets longer period, because of undergoing a masking step with a resist.

The present invention is contemplated to provide a method of producing a semiconductor chip using the plasma dicing method, which does not need a photolithography process, and is able to divide (singulate) with certainty the wafer into chips by a plasma irradiation, whereby occurrence of defective chips can be highly suppressed.

Further, the present invention is contemplated to provide a mask-integrated surface protective tape which can eliminate the need for the mask formation by the photolithography process in the production method of the semiconductor chips using the plasma dicing method, in which the mask formed on a circuit surface using this mask-integrated surface protective tape exhibits a good mask property at the time of the plasma dicing, and can be more certainly removed by ashing. In other words, the present invention is contemplated to provide a mask-integrated surface protective tape which allows simplification and shortening of the production process of the semiconductor chips by the plasma dicing, and also high suppression of occurrence of defective chips.

Solution to Problem

The problems of the present invention are solved by the following means.

[1] A method of producing a semiconductor chip, including the following steps (a) to (d):

(a) a step of, in the state of having laminated a mask-integrated surface protective tape containing a substrate film, a temporary-adhesive layer provided on the substrate film, and a mask material layer provided on the temporary-adhesive layer, on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;

(b) a step of, after integrally peeling both the substrate film and the temporary-adhesive layer from the mask-integrated surface protective tape thereby to expose the mask material layer on top, forming an opening by cutting a portion of the mask material layer corresponding to a street of the semiconductor wafer with a laser;

(c) a plasma dicing step of segmentalizing the semiconductor wafer on the street by a plasma irradiation to singulate it into semiconductor chips; and (d) an ashing step of removing the mask material layer by the plasma irradiation.

[2] The method of producing a semiconductor chip described in the item [1], wherein at least the temporary-adhesive layer of the mask-integrated surface protective tape is radiation-curable, and the step (b) includes a step of curing the temporary-adhesive layer by irradiating a radiation thereto, before integrally peeling both the substrate film and the temporary-adhesive layer thereby to expose the mask material layer on top.

[3] The method of producing a semiconductor chip described in the item [1] or [2], wherein, in the step (c), the plasma irradiation is a fluorine compound-plasma irradiation.

[4] The method of producing a semiconductor chip described in any one of the items [1] to [3], wherein, in the step (d), the plasma irradiation is an oxygen plasma irradiation.

[5] The method of producing a semiconductor chip described in any one of the items [1] to [4], which contains a step (e) of picking up the semiconductor chip from the wafer fixing tape, after the step (d).

[6] The method of producing a semiconductor chip described in the item [5], which contains a step (f) of transiting the picked-up the semiconductor chip to a die bonding step, after the step (e).

[7] A mask-integrated surface protective tape used in the method of producing a semiconductor chip including the following steps (a) to (d), wherein the mask-integrated surface protective tape contains a substrate film, a temporary-adhesive layer and a mask material layer formed on the substrate film in this order, and wherein an etching rate of the mask material layer by a $SF_6$ plasma is lower than an etching rate by an oxygen plasma:

(a) a step of, in the state of having laminated a mask-integrated surface protective tape on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;

(b) a step of, after integrally peeling both the substrate film and the temporary-adhesive layer from the mask-integrated surface protective tape thereby to expose the mask material layer on top, forming an opening by cutting a portion of the mask material layer corresponding to a street of the semiconductor wafer with a laser;

(c) a plasma dicing step of segmentalizing the semiconductor wafer on the street by a plasma irradiation to singulate it into semiconductor chips; and (d) an ashing step of removing the mask material layer by the plasma irradiation.

[8] The mask-integrated surface protective tape described in the item [7], wherein, in the mask material layer, a ratio ($E_{O2}/E_F$) of the etching rate ($E_{O2}$) by the oxygen plasma to the etching rate ($E_F$) by the SF$_6$ plasma is 2.0 or more.

[9] The mask-integrated surface protective tape described in the item [7] or [8], wherein a light transmittance of the mask material layer at the wavelength of 10 μm is 80% or less, and a visible light transmittance of the mask material layer at the wavelength of 350 nm to 700 nm is 50% or more.

[10] The mask-integrated surface protective tape described in any one of the items [7] to [9], wherein the mask material layer contains an acrylate compound having one or two photo-polymerizable carbon-carbon double bonds in the molecule and a content of the acrylate compound is 15% by mass or more.

Advantageous Effects of Invention

The method of producing a semiconductor chip of the present invention allows implementation of the plasma dicing by a more simplified process without a photolithography process. Further, according to the method of producing the semiconductor chip of the present invention, the wafer can be more certainly divided into chips by plasma irradiation, and occurrence of defective chips can be highly suppressed.

The mask-integrated surface protective tape of the present invention is a surface protective tape which is able to eliminate the need for a mask formation by a photolithography process in the method of producing the semiconductor chip using a plasma dicing method. The mask-integrated surface protective tape of the present invention allows simplification of the mask formation process onto a circuit surface, and also the mask formed on the circuit surface exhibits a good mask property at the time of the plasma dicing, and the mask can be more certainly removed by ashing. For this reason, the mask-integrated surface protective tape of the present invention allows simplification and shortening of the process of producing the semiconductor chip and also high suppression of occurrence of defective chips.

Other and further features and advantages of the invention will appear more fully from the following description, appropriately referring to the accompanying drawings.

BRIEF DESCRIPTION OF DRAWINGS

FIGS. 1(a) to 1(c) are schematic cross-sectional views illustrating steps to laminating a surface protective tape onto a semiconductor wafer in the first embodiment of the present invention. Fragmentary FIG. 1(a) shows a semiconductor wafer. Fragmentary FIG. 1(b) shows how the mask-integrated surface protective tape is laminated. Fragmentary FIG. 1(c) shows a semiconductor wafer on which the mask-integrated surface protective tape is laminated.

FIG. 2(a) shows thinning step of the semiconductor wafer. Fragmentary FIG. 2(b) shows how a wafer-fixing tape is laminated. Fragmentary FIG. 2(c) shows a state in which the semiconductor wafer is fixed to a ring flame.

FIG. 3(a) shows how the surface protective tape is peeled off from the mask-integrated surface protective tape while leaving the mask material layer. Fragmentary FIG. 3(b) shows a state in which the mask material layer of the mask-integrated surface protective tape is exposed (uncovered). Fragmentary FIG. 3(c) shows a step of cutting off the mask material layer corresponding to the street with a laser.

FIG. 4(a) shows how the plasma dicing is carried out. Fragmentary FIG. 4(b) shows a state in which the semiconductor wafer is singulated into chips. Fragmentary FIG. 4(c) shows how the plasma ashing is carried out.

FIGS. 5(a) and 5(b) are schematic cross-sectional views illustrating steps to picking up a chip in the first embodiment of the present invention. Fragmentary FIG. 5(a) shows a state, in which the mask material layer is removed. Fragmentary FIG. 5(b) shows how the chip is picked up.

FIG. 6(a) shows a state in which both sides of the front and the back of the semiconductor wafer are covered and fixed with the mask-integrated surface protective tape and the wafer-fixing tape, respectively. Fragmentary FIG. 6(b) shows how an ultraviolet light is irradiated. Fragmentary FIG. 6(c) shows how the surface protective tape is peeled off from the mask-integrated surface protective tape while leaving the mask material layer.

DESCRIPTION OF EMBODIMENTS

Figure 2A:
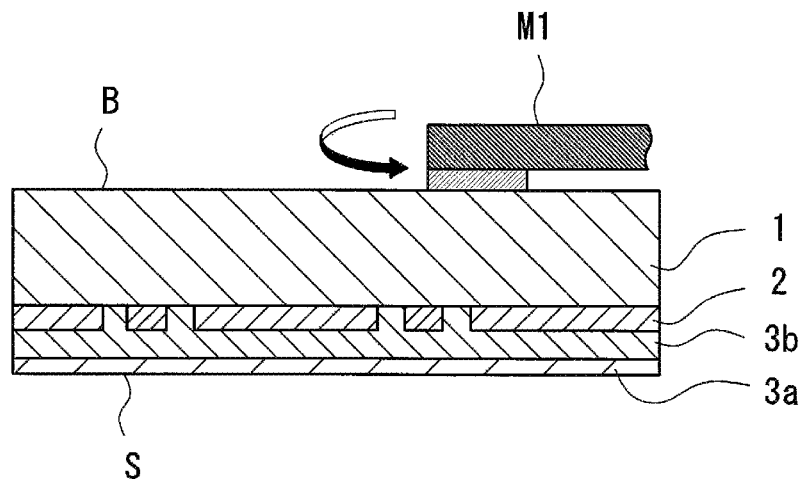
FIGS. 2(a) to 2(c) are schematic cross-sectional views illustrating steps to thinning and fixing of the semiconductor wafer in the first embodiment of the present invention. Fragmentary
Figure 2B:
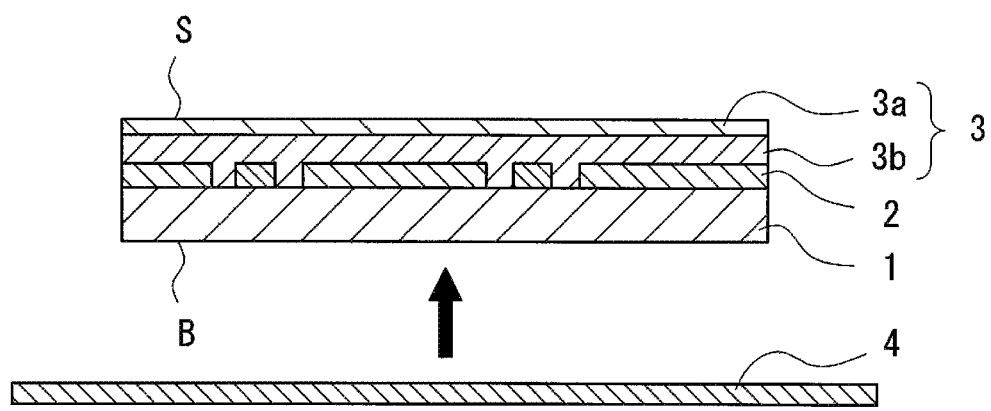

[Method of Producing Semiconductor Chip of the Present Invention]

The method of producing the semiconductor chip of the present invention (hereinafter, referred to simply as the production method of the present invention) is a method of obtaining a semiconductor chip by the plasma dicing. As described below, the production method of the present invention does not need a photolithography process, and allows a significant suppression of production costs of the semiconductor chips or semiconductor products.

The method of producing the present invention includes, at least, the following steps (a) to (d):

(a) a step of, in the state of having laminated a mask-integrated surface protective tape containing a substrate film, a temporary-adhesive layer provided on the substrate film, and a mask material layer provided on the temporary-adhesive layer, on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;

(b) a step of, after integrally peeling both the substrate film and the temporary-adhesive layer from the mask-integrated surface protective tape (in other words, after peeling a surface protective tape from the mask-integrated surface protective tape) thereby to expose the mask material layer on top, forming an opening by cutting a portion of the mask material layer corresponding to a street of the semiconductor wafer with a laser;

(c) a plasma dicing step of segmentalizing the semiconductor wafer on the street by a plasma irradiation to singulate it into semiconductor chips; and (d) an ashing step of removing the mask material layer by the plasma irradiation.

In the present invention, the following step (e), after the step (d), is preferably included. In the present invention, when the production method includes following step (e), the following step (f) is preferably included after the step (e).

(e) A step of picking up the semiconductor chip from the wafer-fixing tape, (f) A step of transiting the picked-up semiconductor chip to a die bonding step.

The mask-integrated surface protective tape used in the present invention has a substrate film, a temporary-adhesive layer provided on the substrate film, and a mask material layer provided on the temporary-adhesive layer. In the present specification, a laminated body containing a substrate film and a temporary-adhesive layer provided on this substrate film is sometimes called as "a surface protective tape". In other words, the mask-integrated surface protective tape used in the present invention is a tape having a laminated structure in which the mask material layer has been further provided on the temporary-adhesive layer of the surface protective tape. In the mask-integrated surface protective tape used in the present invention, the substrate film, the temporary-adhesive layer and the mask material layer may have each independently a single layer structure or a plural layer structure containing two or more layers. The temporary-adhesive layer and the mask material layer each have preferably a single layer structure.

In the mask-integrated surface protective tape used in the present invention, at least the temporary-adhesive layer is preferably radiation-curable (in other words, has a radiation-curing property), and it is more preferable that only the temporary-adhesive layer is radiation-curable. Further, it is preferable that the mask material layer is pressure-sensitive.

In a case where the temporary-adhesive layer is radiation-curable, in the above-described step (b), it is preferable to contain a step of curing the temporary-adhesive layer by irradiating a radiation thereto, before integrally peeling both the above-described substrate film and the above-described temporary-adhesive layer from the above-described mask-integrated surface protective tape thereby to expose the mask material layer on top. By curing the temporary-adhesive layer, an interlayer-peeling property between the mask material layer and the temporary-adhesive layer is improved, so that the peeling of the surface protective tape from the mask-integrated surface protective tape becomes easy.

Preferable embodiments of the production method of the present invention are described below with reference to the drawings. However, the present invention is not limited to the following embodiments, except for the requirements defined by the present invention. Further, the form shown in each drawing is a schematic view for facilitating the understanding of the present invention. Therefore, regarding the size, the thickness, the relative magnitude relation and the like of each component, the large one or the small one is sometimes changed for the purpose of illustration, and the form does not show a real relation as it is. Further, the present invention is not limited to outer forms and shapes shown in these figures, except for the requirements defined by the present invention.

Preferable embodiments of the method of producing the semiconductor chip of the present invention may be classified into first and second embodiments, as described below.

Note that, as the apparatus, the materials and the like used in the following embodiments, an ordinary apparatus, materials and the like which have been conventionally used in the processing of the semiconductor wafer may be used, unless otherwise indicated, and the conditions of use for them can be appropriately set and optimized in accordance with the intended use within a range of an ordinary method for using.

Further, omitted are duplicated descriptions about the materials, structures, methods, effects, and the like, which are common to each embodiment.

First Embodiment [FIGS. 1 to 5]

The first embodiment of a production method of the present invention is described with reference to FIG. 1 to FIG. 5.

A semiconductor wafer 1 has a patterned face 2 on the surface S of which a circuit or the like of the semiconductor device is formed (see FIG. 1(a)). On this patterned surface 2, a mask-integrated surface protective tape 3 in which a mask material layer 3b has been further provided on a temporary-adhesive layer 3ab of a surface protective tape 3a in which the temporary-adhesive layer 3ab has been provided on a substrate film 3aa, is laminated (see FIG. 1 (b)), whereby a semiconductor wafer 1 whose patterned surface 2 is covered with the mask-integrated surface protective tape 3 is obtained (see FIG. 1 (c)).

Then, the backing-face B of the semiconductor wafer 1 is ground by a wafer-grinding apparatus M1, to thin a thickness of the semiconductor wafer 1 (see FIG. 2(a)). On the ground backing-face B, a wafer-fixing tape 4 is laminated (see FIG. 2(b)), to support and fix the wafer to a ring flame F (see FIG. 2(c)).

Figure 3A:
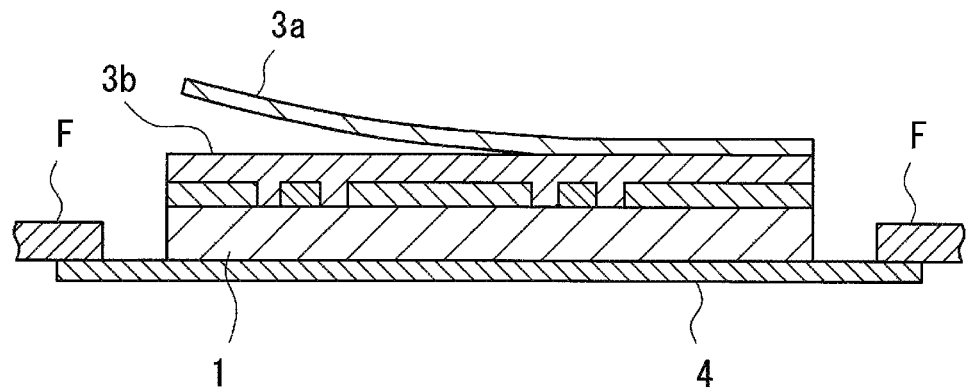
FIGS. 3(a) to 3(c) are schematic cross-sectional views illustrating steps to the mask formation in the first embodiment of the present invention. Fragmentary
Figure 3B:
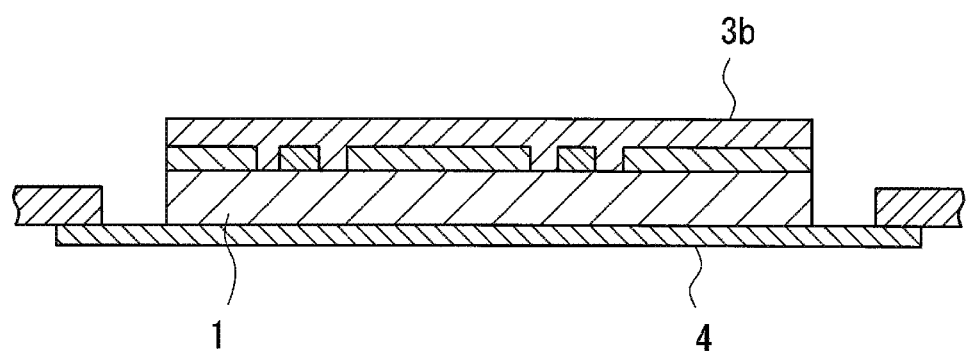
Figure 3C:
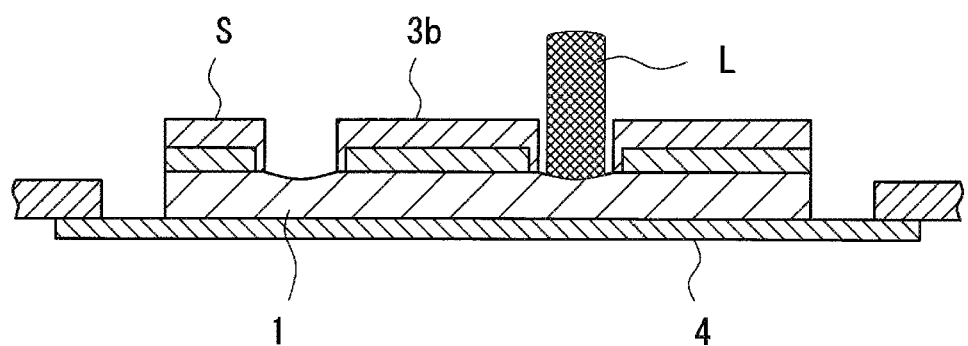

The surface protective tape 3a of the mask-integrated surface protective tape 3 is peeled off from the semiconductor wafer 1, while leaving the mask material layer 3b on the semiconductor wafer 1 (see FIG. 3(a)), so that the mask material layer 3b is exposed (uncovered) (see FIG. 3(b)). Further, $CO_2$ laser L is irradiated from the surface S side toward a plurality of streets (not shown) appropriately formed in a grid pattern or the like onto the patterned face 2, thereby to remove a portion corresponding to a street of the mask material layer 3b, so that streets of the semiconductor wafer are opened (see FIG. 3(c)).

Figure 4A:
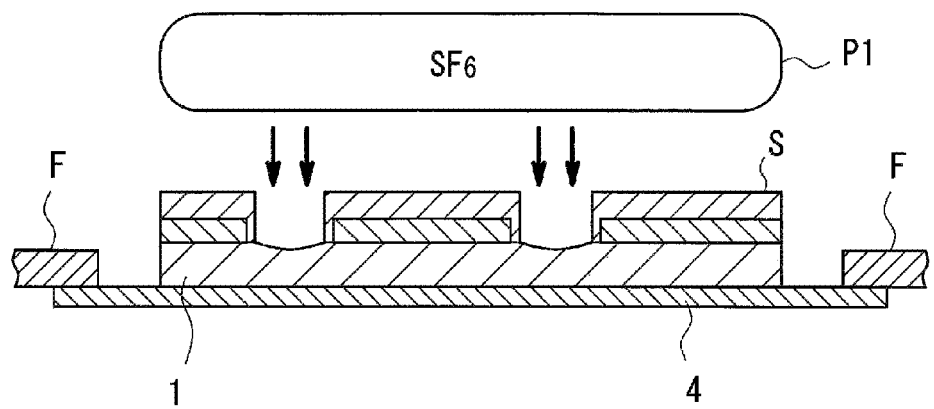
FIGS. 4(a) to 4(c) are schematic cross-sectional views illustrating the plasma dicing and plasma ashing steps in the first embodiment of the present invention. Fragmentary
Figure 4B:
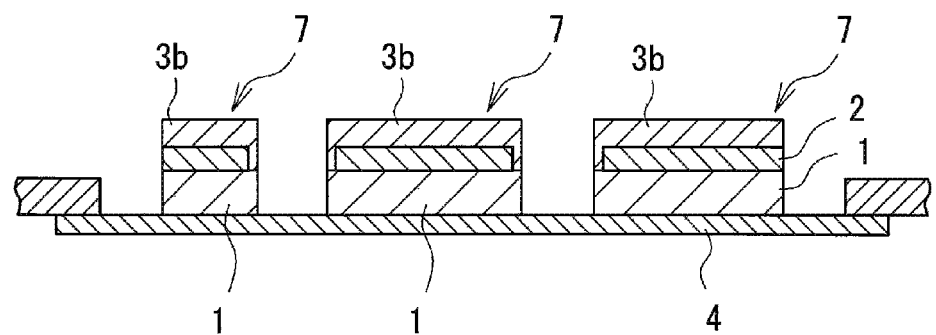
Figure 4C:
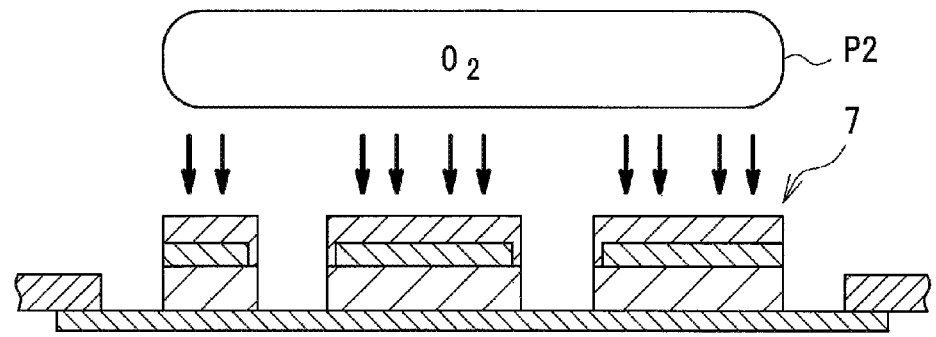

Then, a treatment with the plasma P1 of $SF_6$ gas is carried out from the surface S side, thereby to etch the semiconductor wafer 1 which is exposed at the street portion (see FIG. 4(a)), and the semiconductor wafer is divided into individual chips 7, which results in singulation (see FIG. 4(b)). After that, ashing with the plasma P2 of $O_2$ gas is carried out (see FIG. 4(c)), thereby to remove the mask material layer 3b remaining on the surface S (see FIG. 5(a)). Then, at last, the singulated chip 7 is knocked up by a pin M2, and is picked up by adsorption with a collet M3 (see FIG. 5(b)).

Herein, a process of etching of Si of the semiconductor wafer with the use of $SF_6$ gas is also called as a BOSCH process. This process allows a reaction of the exposed Si and a fluorine atom formed from a plasmarized $SF_6$, thereby to remove the exposed Si as silicon tetrafluoride ($SiF_4$), which is also called as reactive ion etching (RIE). On the other hand, the removal with the $O_2$ plasma is a method which is also used as plasma cleaner in the course of a semiconductor production process, and is also called as ashing (ash-making), which is one of means for removal of the organic substance. This method is carried out, in order to clean an organic substance residue remaining on a semiconductor device surface.

Next, before describing a second embodiment, the materials used in the production method of the present invention are described. These materials may be also preferably used in the second embodiment described below.

The semiconductor wafer 1 is a silicon wafer, on its one side, having the patterned face 2 on which the circuit or the like of the semiconductor device is formed. The patterned face 2 is a face on which the circuit or the like of the semiconductor device is formed, which has a street in a planar view.

The mask-integrated surface protective tape 3 contains the temporary-adhesive layer 3ab provided on the substrate film 3aa, and further the mask material layer provided on the temporary-adhesive layer 3ab, and has a function to protect the semiconductor device formed on the patterned face 2. Specifically, at the wafer-thinning step which is a post-step, the semiconductor wafer 1 is supported by the patterned face 2, and the backing-face of the wafer is ground. Therefore, the mask-integrated surface protective tape 3 needs to withstand a load in grinding. For this reason, the mask-integrated surface protective tape 3 is different from a mere resist film or the like, and has: the thickness enough to coat the device formed on the patterned face; and the pressing resistance which is low, and has: a high adhesiveness that can adhere tightly to the device, so that the infiltration of dusts, grinding water, and the like, in grinding, is not occurred.

Out of the mask-integrated surface protective tape 3, the substrate film 3aa is composed of a plastic, a gum, or the like, and examples of its materials include: a homopolymer or copolymer of α-olefin, such as polyethylene, polypropylene, ethylene/propylene copolymer, polybutene-1, poly-4-methylpentene-1, ethylene/vinyl acetate copolymer, ethylene/acrylic acid copolymer, and ionomers, or a mixture thereof; an elemental substance or a mixture of 2 or more kinds, such as polyethylene terephthalate, polyethylene naphthalate, polyphenylene sulfide, polyether imide, polyimide, polycarbonate, polymethyl methacrylate, polyurethane, and styrene/ethylene/butene- or pentene-based copolymer; and a resin composition in which another resin, a filler, an additive or the like is blended with any of the foregoing polymers. These can be appropriately selected depending on the required characteristics. A laminate of a low-density polyethylene and an ethylene/vinyl acetate copolymer, a laminate of a polypropylene and a polyethylene terephthalate, a polyethylene terephthalate, or a polyethylene naphthalate is one of preferable materials.

The foregoing substrate film 3aa can be produced using a general extrusion method. In the case where the substrate film 3aa is obtained by laminating various resins, these are produced by a co-extrusion method, a lamination method, or the like. At this time, as conventionally practiced in the ordinary production method of the laminate film, an adhesion layer may be provided between resins. A thickness of the substrate film 3aa is preferably from 20 to 200 μm, from the viewpoint of strength and elongation property and the like, and radiation permeation property.

The temporary-adhesive layer 3ab takes a role in protection of the patterned surface together with a mask material by covering an asperity of the device formed on the patterned surface to enhance adhesion property to the patterned surface. In order to make the mask-integrated surface protective tape withstand a load of the wafer-thinning step (backgrinding step), it is preferable that the adhesion property of the temporary-adhesive layer 3ab to a mask material layer 3b or a substrate film 3aa in the wafer-thinning step is high. On the other hand, after the wafer-thinning step, because the temporary-adhesive layer is integrally peeled with the substrate film 3aa from the mask material layer, it is preferable that the adhesion property of the temporary-adhesive layer to the mask material layer is low (high peeling property is preferable). In order to achieve these properties in higher level, it is preferable to adopt a radiation-curable temporary-adhesive in the temporary-adhesive layer 3ab. By rendering the temporary-adhesive layer 3ab radiation-curable, the temporary-adhesive layer becomes 3-dimensionally reticulated by radiation irradiation, which results in reduction of the adhesive force. For this reason, by radiation irradiation after the wafer-thinning step, a rigid adhesion to the mask material layer is released and resultantly the temporary-adhesive layer can be simply peeled from the mask material layer (such specific embodiments are described below). In a case of rendering the temporary-adhesive layer 3ab radiation-curable, the production method of the present invention is preferably carried out in accordance with a second embodiment described below. Note that the temporary-adhesive for the temporary-adhesive layer 3ab in the present invention is not limited to a radiation-curable temporary-adhesive, but also a non-radiation curable temporary-adhesive (pressure-sensitive temporary-adhesive) may be used in a range of providing a desired property. In this case, the production method of the present invention is preferably carried out in accordance with the above-described first embodiment.

In the present specification, the term "radiation" is a concept including both a light beam such as ultraviolet, and an ionizing radiation such as an electron beam. The radiation for use of the present invention is preferably ultraviolet.

In a case where the temporary-adhesive layer 3ab is composed of a radiation-curable temporary-adhesive, a temporary-adhesive containing an acrylic temporary-adhesive and a radiation-polymerizable compound may be preferably used.

The acrylic temporary-adhesive is a (meth)acrylic copolymer, or a mixture of a (meth)acrylic copolymer and a curing agent. Examples of the (meth)acrylic copolymer include a copolymer having a (meth)acrylic acid ester as a structural component, or a mixture of 2 or more copolymers having a (meth)acrylic acid ester as a structural component. The mass-average molecular weight of these copolymers is normally about 300,000 to 1,000,000. A proportion of the (meth)acrylic acid ester component of the total monomer component of the (meth)acrylic copolymer is preferably 70% or more, more preferably 80% or more, and further more preferably 90% or more. Further, in a case where the proportion of the (meth)acrylic acid ester component of the total monomer component of the (meth)acrylic copolymer is not 100% by mole, it is preferable that the remaining monomer component is a monomer component (constituent and the like derived from (meth)acrylic acid) existing in the form of (meth)acryloyl group polymerized as a polymerizable group. Further, the proportion of the (meth)acrylic acid ester component having a functional group (for example, hydroxyl group) reacting with a curing agent described below, of the total monomer component of the (meth)acrylic copolymer is preferably 1% by mole or more, more preferably 2% by mole or more, further more preferably 5% by mole or more, and still further more preferably 10% by mole or more. A proportion of the (meth)acrylic acid ester component is preferably 35% by mole or less, more preferably 25% by mole or less. In addition, the proportion of structural component (monomer component), which has a functional group (for example, hydroxyl group) reacting with a curing agent described below, of the total monomer component of the (meth)acrylic copolymer is preferably 5% by mole or more, more preferably 10% by mole or more. The upper limit is preferably 35% by mole or less, more preferably 25% by mole or less.

The above-described (meth)acrylic acid ester component is preferably a (meth)acrylic acid alkyl ester (also referred to as alkyl (meth)acrylate). The number of carbon atoms of the alkyl group which constitutes the (meth)acrylic acid alkyl ester is preferably from 1 to 20, more preferably from 1 to 15, and further more preferably from 1 to 12.

The curing agent is used for adjusting an adhesion force and a cohesion force, by conducting reaction of it with a functional group of the (meth)acrylic copolymer. Examples of the curing agent include: an epoxy compound having 2 or more epoxy groups in the molecule, such as 1,3-bis(N,N-diglycidyl aminomethyl)cyclohexane, 1,3-bis(N,N-diglycidyl aminomethyl)toluene, 1,3-bis(N,N-diglycidyl aminomethyl)benzene, or N,N,N',N'-tetraglycidyl-m-xylenediamine; an isocyanate-based compound having 2 or more isocyanate groups in the molecule, such as 2,4-tolylenediisocyanate, 2,6-tolylenediisocyanate, 1,3-xylylenediisocyanate, 1,4-xylylenediisocyanate, or diphenylmethane-4,4'-diisocyanate; an aziridine-based compound having 2 or more aziridinyl groups in the molecule, such as tetramethylol-tri-β-aziridinyl propionate, trimethylol-tri-β-aziridinyl propionate, trimethylolpropane-tri-β-aziridinyl propionate, or trimethylolpropane-tri-β-(2-methylaziridine) propionate; and the like. An addition amount of the curing agent may be adjusted depending on a desired adhesion force, and is suitably from 0.1 to 5.0 mass parts with respect to 100 mass parts of the (meth)acrylic copolymer. In the temporary-adhesive layer of the mask-integrated surface protective tape used in the present invention, the curing agent is in a state of having reacted with the (meth)acrylic copolymer.

As for the radiation-polymerizable compound described above, a low-molecular weight compounds having, in the molecule, at least two or more photopolymerizable carbon-carbon double bonds which can be three-dimensionally reticulated by radiation irradiation are widely used. Specifically, use may be widely applicable of: trimethylolpropane triacrylate, tetramethylolmethane tetraacrylate, pentaerythritol triacrylate, pentaerythritol tetraacrylate, dipentaerythritol mono-hydroxypentaacrylate, dipentaerythritol hexaacrylate, 1,4-butyleneglycol diacrylate, 1,6-hexanediol diacrylate, polyethyleneglycol diacrylate, and acrylate-based compounds such as oligo-ester acrylates.

Further, in addition to the acrylate-based compounds, use can be also made of a urethane acrylate-based oligomer. The urethane acrylate-based oligomer is obtained by conducting reaction of an acrylate or methacrylate having a hydroxy group (for example, 2-hydroxyethyl acrylate, 2-hydroxyethyl methacrylate, 2-hydroxypropyl acrylate, 2-hydroxypropyl methacrylate, polyethyleneglycol acrylate, polyethyleneglycol methacrylate, and the like) with a urethane prepolymer having an isocyanate group at the end thereof, which is obtained by conducting reaction of a polyol compound, such as a polyester type- or a polyether type-polyol, and a polyvalent isocyanate compound (for example, 2,4-tolylene diisocyanate, 2,6-tolylene diisocyanate, 1,3-xylylene diisocyanate, 1,4-xylylene diisocyanate, diphenyl methane-4,4'-diisocyanate, and the like).

As a blending ratio of the acrylic temporary-adhesive and the radiation-polymerizable compound in the radiation-curable temporary-adhesive, the radiation-polymerizable compound is desirably blended in the range of 50 to 200 mass parts and preferably 50 to 150 mass parts with respect to 100 mass parts of the acrylic temporary-adhesive. If the blending ratio is in this range, it is possible to decline sharply the adhesion force of the temporary-adhesive layer after radiation irradiation.

Further, as the radiation-curable temporary-adhesive used in the temporary-adhesive layer 3ab, it is also preferable to use a radiation-polymerizable (meth)acrylic copolymer in which the above-described (meth)acrylic copolymer itself has been rendered radiation-polymerizable. In this case, the radiation-curable temporary-adhesive may contain a curing agent.

The radiation-polymerizable (meth)acrylic copolymer is a copolymer having, in the molecule of the copolymer, a reactive group which is capable of realizing a polymerization reaction upon exposure to a radiation, particularly to an ultraviolet. As the reactive group, an ethylenically unsaturated group, in other words, a group having a carbon-carbon double bond, is preferred. Examples thereof include: a vinyl group, an allyl group, a styryl group, a (meth)acryloyloxy group, a (meth)acryloylamino group, and the like.

The introduction of the above-described reactive group to the copolymer may be performed, for example, by reacting a copolymer having a hydroxyl group with a compound having both a group (for example, isocyanate group) reacting with the hydroxyl group and the above-described reactive group [representatively 2-(meth)acryloyloxyethyl isocyanate].

Further, the proportion of the monomer component having the above-described reactive group of the total monomer component which constitutes the above-described radiation-polymerizable (meth)acrylic copolymer is preferably from 2 to 40% by mole, more preferably from 5 to 30% by mole, and further more preferably from 10 to 30% by mole.

Further, in the case of conducting polymerization and curing of a temporary-adhesive layer 3ab by radiation, a photopolymerization initiator, for example, isopropylbenzoin ether, isobutylbenzoin ether, benzophenone, Michler's ketone, chlorothioxanthone, benzyl methyl ketal, α-hydroxycyclohexyl phenyl ketone, 2-hydroxymethylphenyl propane, and the like can be used. By adding at least one of these compounds to the temporary-adhesive layer, a polymerization reaction can be efficiently accelerated.

The temporary-adhesive layer 3ab may further contain a photosensitizer, any of known tackifier, softener, antioxidant, or the like.

As for the temporary-adhesive layer 3ab, those embodiments described at paragraphs [0036] to [0055] of JP-A-2014-192204 are also preferably applied.

The thickness of the temporary-adhesive layer 3ab is preferably from 5 to 100 μm, more preferably from 10 to 100 μm, and further more preferably from 2 to 50 μm, from the viewpoint of more increasing protective ability to the device and the like formed on the patterned surface 2, and more increasing adhesion to the patterned surface, and also more increasing removal ability by an ashing treatment. In this regard, depending on the variety of the device, an asperity of the patterned surface is approximately about a few micrometers to about 15 μm, and therefore the thickness of the temporary-adhesive layer 3ab is preferably from 5 to 30 μm.

In the mask material layer 3b, a non-radiation curable, so-called pressure-sensitive temporary-adhesive is preferably used. As this pressure-sensitive temporary-adhesive, a mixture of the above-described (meth)acrylic copolymer and a curing agent may be preferably used.

Further, it is also preferable that the mask material layer has an etching rate property described below. In this case, it is also preferable to use a radiation-curable temporary-adhesive in the mask material layer 3b.

The thickness of the mask material layer 3b is preferably from 1 to 50 μm and more preferably from 5 to 20 μm, from the viewpoint of a following capability to the patterned surface and a removing ability by plasma.

The wafer-fixing tape 4 is required to hold the semiconductor wafer 1 and to have resistance to plasma which is sustainable even if the wafer-fixing tape is subjected to the plasma dicing step. Further, in the picking-up step, a good picking-up property and also an expansion property and the like in some cases are required. As the foregoing wafer-fixing tape 4, a tape similar to the surface protective tape 3a may be used. Further, use may be made of any of known dicing tapes used in a conventional plasma dicing method, which are generally called as a dicing tape. Further, the use can be also made of a dicing die-bonding tape, in which an adhesion bond for die-bonding is laminated between the temporary-adhesive layer and the substrate film, in order to make it easy to transit to the dicing die-bonding step after picking-up.

For the laser irradiation with which the mask material layer 3b is cut, use can be made of a laser irradiator for irradiating an ultraviolet or infrared laser light. In this laser irradiator, a laser irradiation part capable of freely moving along the street of the semiconductor wafer 1 is arranged. Laser can be irradiated, which is provided with an output controlled suitably to remove the mask material layer 3b. In particular, if $CO_2$ laser is used as a laser light, it is possible to obtain a large power of several to tens of watts. $CO_2$ laser can be preferably used for the present invention.

In order to carry out the plasma dicing and the plasma ashing, use can be made of a plasma-etching apparatus. The plasma-etching apparatus is an apparatus, which is capable of subjecting the semiconductor wafer 1 to dry etching, and in which a sealed treatment space is made in a vacuum chamber, to place the semiconductor wafer 1 on the side of the electrode for a high-frequency wave. A gas for plasma generation is supplied from the side of a gas-supplying electrode provided facing the electrode for high-frequency wave. If a high-frequency voltage is applied to the electrode for a high-frequency wave, plasma is generated between the gas-supplying electrode and the electrode for a high-frequency wave. Therefore, the resultant plasma is used. By circulating a refrigerant in a heat-producing electrode for high-frequency wave, it is possible to prevent a temperature elevation of the semiconductor wafer 1 due to the heat of this plasma.

In accordance with the method of producing the semiconductor chip (the method of processing the semiconductor wafer), any photolithographic step or the like becomes unnecessary, which is provided with a resist to be used in the conventional plasma dicing process, by giving a mask function in the plasma dicing to the surface protective tape protecting the patterned face. In particular, by using the surface protective tape, a technique becomes unnecessary, in which a high level of alignment, such as printing and transferring, is required for the mask formation. The surface protective tape can be easily laminated on the semiconductor wafer surface, and a mask can be easily formed by the laser equipment.

Further, the mask material layer 3b can be removed with $O_2$ plasma, and therefore removal of the mask portion can be carried out by the same apparatus as the plasma dicing apparatus. In addition, the plasma dicing is carried out from the patterned face 2 side (surface S side), and therefore it is not necessary to turn the chip upside down before the picking-up operation. From these reasons, the facilities can be simplified, and process costs can be considerably suppressed.

Figure 6:
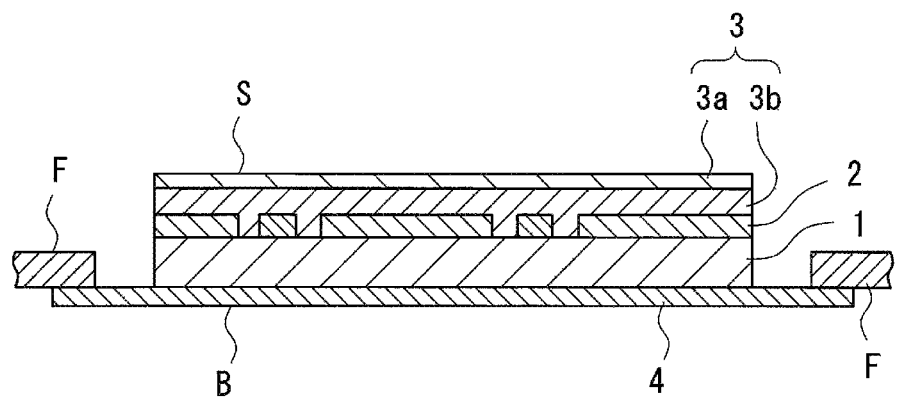
FIGS. 6(a) to 6(c) are schematic cross-sectional views illustrating a state before and after a treatment with an ultraviolet irradiation carrying out in the second embodiment of the present invention. Fragmentary
Figure 6:
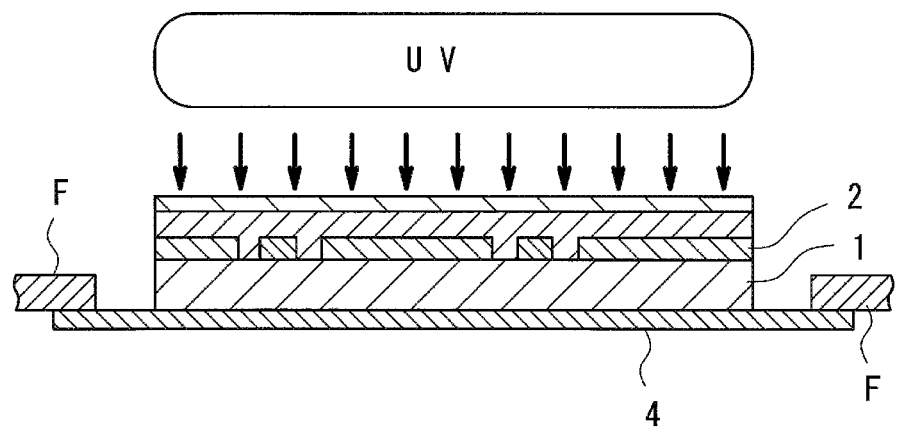
Figure 6:
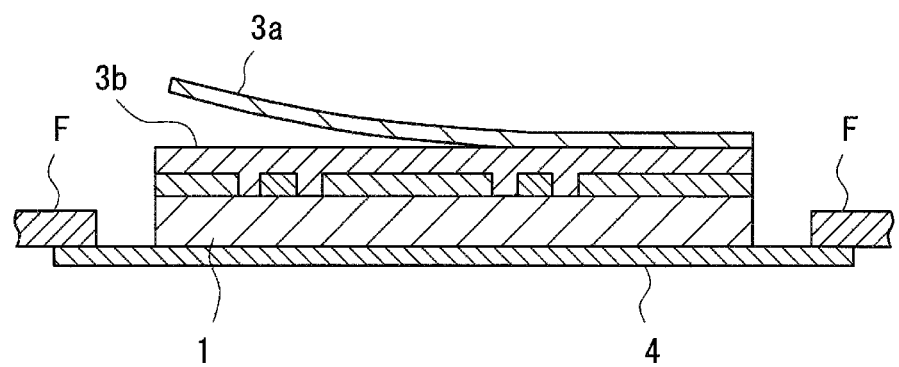

Second Embodiment [FIGS. 6(a) to 6(c)]

The second embodiment is different from the first embodiment in the point that the second embodiment contains a step of curing the temporary-adhesive layer by irradiating the mask-integrated surface protective tape 3 with a radiation, such as an ultraviolet light or the like, prior to the step of peeling-off the surface protective tape 3a in the first embodiment. Other steps are the same as in the first embodiment.

Figure 2C:
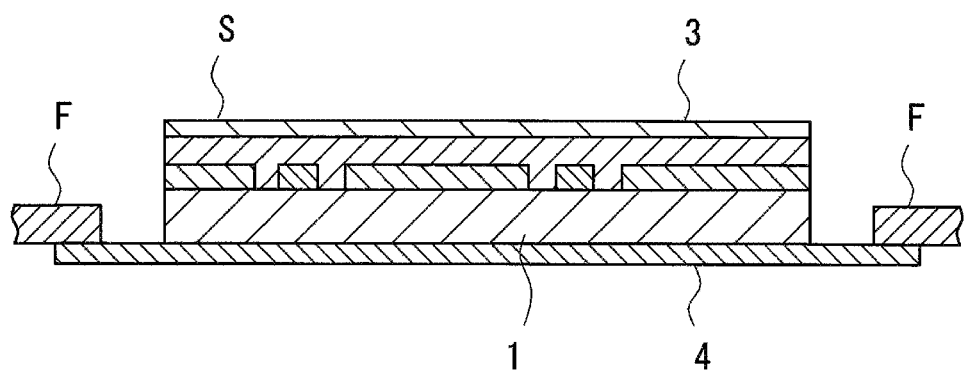

Specifically, the mask-integrated surface protective tape 3 is laminated on the surface S side of the semiconductor wafer 1, and the wafer-fixing tape 4 is laminated on the ground backing-face B side of the semiconductor wafer 1, followed by supporting and fixing the wafer to a ring flame F (see FIG. 2(c), FIG. 6(a)). Then, an ultraviolet light (UV) is irradiated from the surface S side toward the mask-integrated surface protective tape 3 (see FIG. 6(b)). Then, after curing the temporary-adhesive layer 3ab of the mask-integrated surface protective tape 3, the surface protective tape 3a is removed (see FIG. 6(c)), whereby the mask material layer 3b is uncovered. Then, this step is transited to a step of cutting, with a laser L, a portion of the mask material layer 3b corresponding to the street.

In the mask-integrated surface protective tape that can be used in the second embodiment, at variation with the mask-integrated surface protective tape 3 described in the first embodiment, a material which is capable of being cured with a radiation, such as an ultraviolet ray or the like, is used in the temporary-adhesive layer 3ab.

By curing the temporary-adhesive layer 3ab with the ultraviolet light or the like, peeling-off of the surface protective tape 3a from mask material layer 3b is made easily performed.

Subsequently an embodiment of a preferable mask-integrated surface protective tape used in the production method of the present invention (herein, also referred to as "a mask-integrated surface protective tape of the present invention") is described below in more details. However, the mask-integrated surface protective tape used in the production method of the present invention is not limited to the following embodiments, but mask-integrated surface protective tapes in the form described above may be widely used.

<Mask-Integrated Surface Protective Tape of the Present Invention>

The mask-integrated surface protective tape 3 of the present invention is a tape in which a mask material layer 3b is further formed on a temporary-adhesive layer 3ab of the surface protective tape 3a in which the temporary-adhesive layer 3ab has been formed on a substrate film 3aa, and in which an etching rate ($E_F$) of the above-described mask material layer 3b by a $SF_6$ plasma is lower than an etching rate ($E_{O2}$) by an $O_2$ plasma.

In the mask-integrated surface protective tape of the present invention, the substrate film, the temporary-adhesive layer and the mask material layer each may have a single layer structure or a plural layer structure containing 2 layers or more. The temporary-adhesive layer and the mask material layer each have preferably a single layer structure. In the mask-integrated surface protective tape of the present invention, the forms described in the above-described production method of the present invention may be preferably used in the constitution of the substrate film and the temporary-adhesive layer. The constitution of the mask material layer of the mask-integrated surface protective tape of the present invention is described below.

(Mask Material Layer 3b)

In the mask-integrated surface protective tape of the present invention, the mask material layer 3b scarcely damages to a semiconductor device or the like when adhered to a patterned surface 2, and scarcely causes a breakage of the semiconductor device or the like and an adhesive residue on the surface at the time of removal. Further, in the present invention, because the mask material layer 3b has such characteristics that an etching rate ($E_F$) by a $SF_6$ plasma is lower than an etching rate ($E_{O2}$) by an $O_2$ plasma, the mask formed on the circuit surface has a plasma resistance which acts as a mask at the time of plasma dicing, and the formed mask can be more certainly removed by ashing.

As for the mask-integrated surface protective tape of the present invention, the etching rate ($E_F$) of the mask material layer by the $SF_6$ plasma means an etching rate of the mask material layer under the condition of etching a Si wafer at the etching rate of 15 μm/min by the $SF_6$ gas plasma, as described in Example.

Further, in the mask-integrated surface protective tape of the present invention, the etching rate ($E_{O2}$) of the mask material layer by an $O_2$ plasma means an etching rate of the mask material layer under the conditions of etching a mask material layer a at the etching rate of 1 μm/min by the $O_2$ gas plasma, as described in Example.

Further, in the mask-integrated surface protective tape of the present invention, $E_{O2}/E_F$, which is a ratio of an etching rate ($E_{O2}$) by an $O_2$ plasma to an etching rate ($E_F$) by a $SF_6$ plasma, is preferably 2.0 or more, more preferably 4.0 or more, and further more preferably 6.0 or more. The upper limit thereof is not particularly limited, but is 8.0 or less in practice.

Note that, in a case where the mask material layer is composed of a radiation-polymerizable mask material, the above-described etching rate means an etching rate of the mask material layer after it has been subjected to a radiation polymerization.

Further, in the mask-integrated surface protective tape of the present invention, it is preferable that the light transmittance at the wavelength of 10 μm (hereinafter, also referred to as a light transmittance$_{10\ \mu m}$) of the mask material layer 3b is 80% or less and the visible light transmittance at the wavelength of 350 to 700 nm (hereinafter, also referred to as a visible light transmittance$_{350-700\ nm}$) is 50% or more.

The light transmittance$_{10\ \mu m}$ is more preferably 79% or less and further more preferably 75% or less. The lower limit thereof is not particularly limited, but is 30% or more in practice.

The visible light transmittance$_{360-700\ nm}$ is more preferably 70% or more, further preferably 90% or more. The upper limit thereof is not particularly limited, but is preferably 100% or less.

Under the conditions that the light transmittance$_{10\ \mu m}$ is within the above-described preferable range, a portion of the mask material layer corresponding to a street of the semiconductor wafer can be efficiently cut by a $CO_2$ laser.

Further, under the conditions that the visible light transmittance$_{360-700\ nm}$ is within the above-described preferable range, the patterned surface 2 of the semiconductor wafer can be properly recognized and a recognition error at the time of opening on the street can be prevented.

The above-described light transmittance is measured in accordance with the method described in Example below.

Further, the mask-integrated surface protective tape 3 of the present invention has a function of protecting a patterned surface 2. Specifically, in the wafer-thinning step which is a post step, while the semiconductor wafer 1 is supported at the patterned surface 2 thereof, the backing-face of the wafer is ground, and therefore it is necessary to withstand a grinding load. For this reason, the mask-integrated surface protective tape 3 of the present invention is different from a simple resist film, or the like, and has a thickness enough to coat a device formed on the patterned surface, and has a low pressure resistance, and has a high adhesion property enough to closely adhere to the device in order to avoid entrance of a grinding dust, a grinding water and the like.

In the mask-integrated surface protective tape of the present invention, a variety of performances as described above is required for the mask material layer 3b, and therefore a non-curable mask material having the foregoing properties may be used. Further, a use can be made of a radiation-polymerizable mask material such as an ultraviolet-curable mask material and an ionizable radiation-curable mask material like an electron beam-curable mask material and the like whereby the mask material is 3-dimensionally reticulated by preferably radiation and more preferably ultraviolet irradiation, and a residue of the mask material layer is less likely to be occurred by ashing.

As such mask materials, an acrylic temporary-adhesive and a mask material containing this acrylic temporary-adhesive and a radiation-polymerizable compound may be preferably used.

The above-described acrylic temporary-adhesive is a (meth)acrylic copolymer, or a mixture of a (meth)acrylic copolymer and a curing agent, and acrylic temporary-adhesives described in the foregoing temporary-adhesive layer may be preferably used.

In this regard, from the viewpoint of adhesion property, a proportion of the (meth)acrylic acid ester having a functional group (for example, hydroxyl group) which reacts with a curing agent, of the total monomer component of the (meth)acrylic copolymer, is preferably 0.1% by mole or more, and more preferably 0.5% by mole or more. The upper limit thereof is preferably 20% by mole or less, and more preferably 15% by mole or less. The mass-average molecular weight of the (meth)acrylic copolymer is preferably from about 100,000 to about 1,000,000.

In the mask-integrated surface protective tape of the present invention, for the mask material layer 3b, a radiation-curable temporary-adhesive which is cured by a radiation or a pressure-sensitive temporary-adhesive which is not cured by a radiation may be preferably used.

As the above-described radiation-curable temporary-adhesive, a temporary-adhesive containing the above-described acrylic temporary-adhesive and an acrylate compound having 1 or 2 photo-polymerizable carbon-carbon double bonds in the molecule is preferably used. In the above-described radiation-curable temporary-adhesive, the content of the acrylate compound having 1 or 2 photo-polymerizable carbon-carbon double bonds in the molecule is preferably 15% by mass or more, more preferably from 15 to 70% by mass, and further more preferably from 15 to 65% by mass. Further, the acrylate compound having 1 or 2 photo-polymerizable carbon-carbon double bonds in the molecule is preferably an acrylate compound having 1 photo-polymerizable carbon-carbon double bond in the molecule.

As the above-described acrylate compound having 1 or 2 photo-polymerizable carbon-carbon double bonds in the molecule, specifically, it is possible to use widely and preferably 2-hydroxy-3-phenoxypropyl acrylate, 1,4-butylene glycol diacrylate, 1,6-hexanediol acrylate, polyethylene glycol diacrylate and the like.

Further, a urethane acrylate oligomer having 1 or 2 photo-polymerizable carbon-carbon double bonds in the molecule can be preferably used, and the urethane acrylate oligomer obtained by a method described in the foregoing section of the temporary-adhesive layer can be preferably used.

As a blend ratio of an acrylic temporary-adhesive and an acrylate compound having 1 or 2 photo-polymerizable carbon-carbon double bonds in the molecule in the above-described radiation-curable temporary-adhesive, the acrylate compound having 1 or 2 photo-polymerizable carbon-carbon double bonds in the molecule is blended in the range of preferably 10 to 250 parts by mass and more preferably 15 to 200 parts by mass, with respect to 100 parts by mass of the acrylic temporary-adhesive. When the blend ratio is not more than the above-described upper limit, breakage of the wafer can be prevented effectively without an excessive deformation of the mask material layer at the time of backgrinding.

Further, in the mask-integrated surface protective tape of the present invention, for the mask material layer, a radiation-polymerizable (meth)acrylic acid ester in the foregoing temporary-adhesive layer, a photo-polymerization initiator, and other inclusion components (photosensitizer, conventionally known tackifier, softener, antioxidant, and the like) may be preferably used.

In the mask-integrated surface protective tape of the present invention, the thickness of the mask material layer 3b is preferably 5 to 100 µm, and more preferably 5 to 30 µm, from the viewpoint of more increasing a protection ability of a device or the like formed on the patterned surface 2, and also more increasing adhesion property to the patterned surface, whereby the entrance of $SF_6$ gas is prevented, and a removing property due to an ashing treatment is increased. Note that, depending on the variety of the devices, the asperity of the patterned surface thereof is approximately from about a few micrometers to about 15 µm, and therefore the thickness of the mask material layer 3b is more preferably 5 to 30 µm.

Each of the above-described embodiments is an example of the present invention and therefore the present invention is not limited to these embodiments. Accordingly, addition, deletion, modification and the like of a known process may be made in each process to the extent of no departure from the scope of the present invention.

EXAMPLES

The present invention will be described in more detail based on examples given below, but the invention is not meant to be limited by this.

[Reference Example 1] Production of Mask-Integrated Surface Protective Tape-1

<Preparation of Surface Protective Tape 3a>

With an acrylic polymer (random polymer) composed of constituents originated from each monomer of 80 mol % of 2-ethylhexyl acrylate, 1 mol % of methyl acrylate and 19 mol % of 2-hydroxyethyl acrylate, 2-isocyanatoethyl methacrylate having an ethylenical unsaturated bond (photo-reactive group) and an isocyanate group in the molecule (MOI, manufactured by Showa Denko K.K.) was reacted, to obtain an acrylic polymer A1 (Mw: 800,000, acid value: 12 mg KOH/g, hydroxyl value: 43 mg KOH/g, double bond equivalent: 0.9 eq) having an ethylenical unsaturated bond in the molecule.

A temporary-adhesive composition A was obtained by blending 2.0 parts by mass of an isocyanate curing agent (trade name: L-45, manufactured by Tosoh Corporation) and 5.0 parts by mass of a photo-polymerization initiator (trade name: ESACURE KIP 100F, manufactured by Lamberti) with respect to 100 mass parts of the acrylic polymer A1.

A film formation was carried out by an extrusion method so as to be a film thickness of 110 µm using a LDPE (low density polyethylene) resin (NIPOLONHARD 205, manufactured by Tosoh Corporation) and EVA (ethylene-vinyl acetate copolymer) resin (ULTRATHENE 540, manufactured by Tosoh Corporation) to prepare a substrate film 3aa having a 2-layered structure.

A surface protective tape 3a was obtained by coating and drying the above-described temporary-adhesive composition A on a release film, and then laminating and transferring the formed temporary-adhesive layer on an EVA layer of the above-described substrate film 3aa to form a radiation-curable temporary-adhesive layer 3ab having a thickness of 20 µm.

<Preparation of Mask-Integrated Surface Protective Tape 3>

With respect to 100 parts by mass of an acrylic polymer A2 (random polymer, Mw: 1,000,000, acid value: 23 mg KOH/g, hydroxyl value: 0 mg KOH/g) composed of constituents originated from each monomer of 95 mol % of butyl acrylate and 5 mol % of methyl acrylate, 2.0 parts by mass of an epoxy curing agent (TETRAD-C, manufactured by Mitsubishi Gas Chemical Company, Inc.) was blended, to obtain a mask material composition A. A mask-integrated surface protective tape 3 was obtained by forming a film on the side of the temporary-adhesive layer 3ab of the above-described surface protective tape 3a using this mask material composition A so as to be a dried film thickness of 10 µm thereby to form a mask material layer 3b which is a pressure-sensitive temporary-adhesive layer.

[Example 1] Production of Semiconductor Chip-1

The obtained mask-integrated surface protective tape 3 was laminated on a silicon wafer (diameter: 8 inches) using a tape laminator (trade name: DR-300011, manufactured by Nitto Seiki Co., Ltd.). The wafer laminated with the mask-integrated surface protective tape 3 was ground until the thickness of 50 µm using a backgrinding apparatus (trade name: DGP8760, manufactured by Disco Corporation). The presence or absence of the crack in the wafer at that time was determined visually and also by using a microscope.

An UV-curable wafer fixing tape 4 (trade name: UC-353EP-110, manufactured by Furukawa Electric Co., Ltd.) was laminated on the ground wafer backing-face side, followed by supporting and fixing by using the ring flame. Next, an ultraviolet light was irradiated from the side of the mask-integrated surface protective tape 3, and then the surface protective tape 3a was peeled off, leaving the mask material layer 3b. And by irradiating with the $CO_2$ laser along the street portion of the silicon wafer from the top of the uncovered mask material layer 3b, the mask material layer 3b was removed, to form an opening at the street portion.

After that, plasma dicing was carried out, by plasma irradiating with $SF_6$ gas as a plasma generating gas, at the etching speed of 0.5 µm/min, from the surface side of the uncovered mask material layer 3b, so that the wafer was cut, followed by dividing into individual chips. Then, ashing was carried out, with $O_2$ gas as a plasma generating gas, at the etching speed of 1.0 µm/min, thereby to remove the mask material layer 3b, to obtain the semiconductor chips.

[Reference Example 2] Preparation of Mask-Integrated Surface Protective Tape-2

A mask-integrated surface protective tape was obtained in the same manner as in Reference Example 1, except that the mask material composition B was prepared using an acrylic polymer B (random polymer, Mw: 350,000, acid value: 23 mg KOH/g, hydroxyl value: 3.6 mg KOH/g) composed of constituents originated from each monomer of 47 mol % of butyl acrylate, 47 mol % of 2-ethylhexyl acrylate, 5 mol % of methyl acrylate and 1 mol % of 2-hydroxyethyl acrylate in place of the acrylic polymer A2 used in the mask material composition A in Reference Example 1, and further the mask material layer 3b which is a pressure-sensitive temporary-adhesive layer was prepared using this mask material composition B.

[Example 2] Production of Semiconductor Chip-2

Semiconductor chips were obtained in the same manner as in Example 1, except that as the mask-integrated surface protective tape 3 in Reference Example 1, the mask-integrated surface protective tape prepared in Reference Example 2 was used in place of the mask-integrated surface protective tape prepared in Reference Example 1.

[Reference Example 3] Preparation of Mask-Integrated Surface Protective Tape-3

A mask-integrated surface protective tape was obtained in the same manner as in Reference Example 1, except that PET (polyethylene terephthalate) film having a thickness of 50 μm was used in place of the substrate film having a structure of 2 layers composed of LDPE and EVA as the substrate film 3aa in Reference Example 1.

[Example 3] Production of Semiconductor Chip-3

Semiconductor chips were obtained in the same manner as in Example 1, except that as the mask-integrated surface protective tape 3 in Reference Example 1, the mask-integrated surface protective tape prepared in Reference Example 3 was used in place of the mask-integrated surface protective tape prepared in Reference Example 1.

[Reference Example 4] Preparation of the Mask-Integrated Surface Protective Tape-4

A mask-integrated surface protective tape was obtained in the same manner as in Reference Example 1, except that a single layer film (thickness: 100 μm) of EVA resin (ULTRA-THENE 510, manufactured by Tosoh Corporation) was used in place of the substrate film having a structure of 2 layers composed of LDPE and EVA as the substrate film 3aa in Reference Example 1.

[Example 4] Production of the Semiconductor Chip-4

Semiconductor Chips were Obtained in the Same Manner as in Example 1, except that as the mask-integrated surface protective tape 3 in Reference Example 1, the mask-integrated surface protective tape prepared in Reference Example 4 was used in place of the mask-integrated surface protective tape prepared in Reference Example 1.

[Comparative Example 1] Production of the Semiconductor Chip-5

A resist layer was formed by spin-coating a positive-working photosensitive material on a silicon wafer (diameter: 8 inches) using a spin-coater so as to be a film thickness of 10 μm. After exposing a scribe line portion of the above-described resist layer, development was carried out with tetramethyl ammonium hydroxide to obtain a wafer having a mask in which an opening was formed on the scribe line. The surface protective tape 3a (without a mask material layer) prepared in Reference Example 1 was laminated on the mask of this wafer having the mask.

The wafer having the surface protective tape laminated thereon was ground until the thickness of 50 μm using a backgrinding apparatus (trade name: DGP8760, manufactured by Disco Corporation). The presence or absence of the crack in the wafer at that time was determined visually and by using a microscope.

A UV-curable wafer fixing tape 4 (trade name: UC-353EP-110, manufactured by Furukawa Electric Co., Ltd.) was laminated on the backing-face side of the ground wafer and was supported and fixed using a ring frame. Then the ultraviolet is exposed from the surface protective tape side, the surface protective tape is peeling off, remaining the mask material.

After that, plasma dicing was carried out, by plasma irradiating with $SF_6$ gas as a plasma generating gas, at the etching speed of 0.5 μm/min, from the surface side of the uncovered mask, so that the wafer was cut, followed by dividing into individual chips. Then, ashing was carried out, with $O_2$ gas as a plasma generating gas, at the etching speed of 1.0 μm/min, thereby to remove the mask.

In each of the above-described Examples and Comparative Examples, a grinding property, an opening property and a plasma competence were evaluated in accordance with the following criteria.

—Grinding Property—
⊚: No crack was occurred in the wafer by the backgrinding.
○: A crack due to the backgrinding slightly occurred in the wafer, but it was a level of no matter in practice.
x: A crack due to the backgrinding occurred in the wafer, and it was a problematic level in practice.

—Opening Property—
○: The mask on the scribe line was completely removed by a laser irradiation.
x: The mask remained on the scribe line even by a laser irradiation.

—Plasma Competence—
○: The wafer was completely divided by a plasma irradiation with a $SF_6$ gas.
x: The wafer was not completely divided even by a plasma irradiation with a $SF_6$ gas.

TABLE 1

|  | Example 1 | Example 2 | Example 3 | Example 4 | Comparative Example 1 |
|---|---|---|---|---|---|
| Substrate film | LDPE + EVA (2-layered) | LDPE + EVA (2-layered) | PET (1-layered) | EVA (1-layered) | LDPE + EVA (2-layered) |
| Temporary adhesive layer | Adhesive composition A | Adhesive composition A | Adhesive composition A | Adhesive composition A | Adhesive composition A |

TABLE 1-continued

|  | Example 1 | Example 2 | Example 3 | Example 4 | Comparative Example 1 |
|---|---|---|---|---|---|
| Mask material layer | Mask material composition A | Mask material composition B | Mask material composition A | Mask material composition A | Photo resist |
| Grinding property | ◉ | ○ | ◉ | ○ | ○ |
| Opening property | ○ | ○ | ○ | ○ | ○ |
| Plasma competence | ○ | ○ | ○ | ○ | X |

In Examples 1 to 4, good results were achieved in any of the grinding property, the opening property and the plasma competence. In contrast, in Comparative Example 1, although the grinding property and the opening property were of no matter, when the surface protective tape was peeled from the mask, an adhesive deposit occurred at the opening portion on the scribe line thereof. As a result, the silicon was not adequately etched at the etching with the $SF_6$ gas.

Note that the evaluation "○" of the opening property in Comparative Example 1 means that the mask on the scribe line was completely removed by development.

[Production of Mask-Integrated Surface Protective Tape]

(Sample 1)

With respect to 100 parts by mass of an acrylic polymer having, in the following molar ratio as a constituent unit, constituent units each originated from 80 mol % of 2-ethylhexyl acrylate, 1 mol % of methyl acrylate and 19 mol % of 2-hydroxyethyl acrylate, 2-isocyanatoethyl methacrylate having a photo-polymerizable carbon-carbon double bond and an isocyanate group in the molecule (trade name: MOI, manufactured by Showa Denko K.K.) was reacted, to obtain an acrylic polymer a (Mw: 750,000, acid value: 6 mg KOH/g, hydroxyl value: 30 mg KOH/g) having a photo-polymerizable carbon-carbon double bond in the molecule.

A temporary-adhesive composition a was obtained by blending 2.0 parts by mass of an isocyanate curing agent (trade name: L-45, manufactured by Tosoh Corporation) and 5.0 parts by mass of a photo-polymerization initiator (trade name: ESACURE KIP 100F, manufactured by Lamberti) with respect to 100 mass parts of the acrylic polymer a.

A film formation was carried out by an extrusion method so as to be a film thickness of 110 μm using a low density polyethylene (LDPE) resin (trade name: NIPOLONHARD 205, manufactured by Tosoh Corporation) and ethylene-vinyl acetate copolymer (EVA) resin (trade name: ULTRATHENE 540, manufactured by Tosoh Corporation) to prepare a substrate film a (3aa), separately.

A temporary-adhesive tape a was obtained by coating and drying the above-described temporary-adhesive composition a on the EVA layer of the above-described substrate film a so as to be a dry thickness of 20 μm, whereby a temporary-adhesive layer (3ab) was formed.

With respect to 100 parts by mass of an acrylic polymer b (Mw: 350,000, acid value: 21 mg KOH/g, hydroxyl value: 1 mg KOH/g) composed of constituents originated from each monomer of 47 mol % of butyl acrylate, 47 mol % of 2-ethylhexyl acrylate, 5 mol % of methyl acrylate and 1 mol % of 2-hydroxyethyl acrylate, 2.0 parts by mass of an epoxy curing agent (trade name: TETRAD-C, manufactured by Mitsubishi Gas Chemical Company, Inc.) was blended, to obtain a mask material composition a.

A mask-integrated surface protective tape a (3) was obtained by coating and drying the above-described mask material composition a on the temporary-adhesive layer (3ab) of the above-described temporary-adhesive tape a so as to be a dry thickness of 10 μm, whereby a mask material layer a (3b) was stacked thereon.

(Sample 2)

A mask material composition b was obtained by blending 25 parts by mass of an acrylate monomer having one photo-polymerizable carbon-carbon double bond in the molecule (trade name: M-5700, manufactured by Toagosei Co., Ltd.), 1 part by mass of an epoxy curing agent (trade name: TETRAD-C, manufactured by Mitsubishi Gas Chemical Company Inc.) and 5.0 parts by mass of a photo-polymerization initiator (trade name: ESACURE KIP 100F, manufactured by Lamberti) with respect to 100 parts by mass of an acrylic polymer c (Mw: 250,000, acid value: 47 mg KOH/g, hydroxyl value: 8 mg KOH/g) having, in the following molar ratio as a constituent unit, constituent units each originated from 75 mol % of methyl acrylate, 10 mol % of 2-ethylhexyl acrylate, 7 mol % of methacrylic acid, and 8 mol % of 2-hydroxyethyl acrylate.

A mask-integrated surface protective tape b (3) was obtained in the same manner as in Sample 1, except that the mask material composition b was used in place of the mask material composition a.

(Sample 3)

A mask material composition c and a mask-integrated surface protective tape c (3) using this mask material composition were obtained in the same manner as in Sample 2, except that a blend amount of the acrylate monomer having one photo-polymerizable carbon-carbon double bond in the molecule (trade name: M-5700, manufactured by Toagosei Co., Ltd.) with respect to 100 parts by mass of the acrylic polymer c in the Sample 2 was changed to 150 parts by mass.

(Sample c1)

A mask material composition e and a mask-integrated surface protective tape e using this mask material composition were obtained in the same manner as in Sample 2, except that 100 parts by mass of an acrylate oligomer having five photo-polymerizable carbon-carbon double bonds in the molecule (trade name: BEAMSET 575, manufactured by Arakawa Chemical Industries, Ltd.) and 10 parts by mass of an acrylate oligomer having three photo-polymerizable carbon-carbon double bonds in the molecule (trade name: CN944, manufactured by Sartomer) were used in place of the acrylate monomer having one photo-polymerizable carbon-carbon double bond in the molecule (trade name: M-5700, manufactured by Toagosei Co., Ltd.) in Sample 2, with respect to 100 parts by mass of the acrylic polymer C.

<Evaluation>

Using each of the above-obtained mask-integrated surface protective tapes a to c and e, the processing steps of the semiconductor wafer shown below were performed, and evaluation of each of the mask-integrated surface protective tapes was conducted.

(Peeling Property)

First, the mask-integrated surface protective tape (3) was laminated on the patterned face side of the silicon wafer (Si wafer) with a diameter of 8 inches so as to have roughly the same diameter as the wafer, and then the wafer was ground with a back grinder [DFD8540 (manufactured by DISCO Inc.)] until the wafer thickness would reach 50 µm.

Next, after irradiating an ultraviolet light at 500 mJ/cm$^2$ from the mask-integrated surface protective tape side, a UV-curable dicing tape (trade name: UC-353EP-110, manufactured by Furukawa Electric Co., Ltd.) was laminated on the backing-face side of the ground wafer, and then the resultant was supported and fixed with a ring frame. The surface protective tape (temporary-adhesive layer 3ab and substrate tape 3aa) was peeled off, leaving the mask material layer (3b).

The sample in which only the surface protective tape could be peeled off and the mask material layer was remaining on the wafer was evaluated as "A", whereas the other case was evaluated as "C".

Herein, evaluation of Sample c1 was "C". This is because when the surface protective tape was peeled off, a part of the mask material layer was peeled from the wafer.

With respective to the wafer having a mask material layer, which was obtained in the above-described peeling test, the mask material layer (3b) was removed by $CO_2$ laser from the top of the exposed mask material layer along the street portion of the silicon wafer, whereby an opening of 50 µm was formed on the street portion.

Next, using a $SF_6$ gas as a plasma-generating gas, a plasma irradiation was carried out from the surface side of the exposed mask material layer. By performing plasma dicing, the wafer was cut and divided into individual chips. The etching was performed under the condition that an etching rate of the Si wafer gets to 15 µm/min, and under this condition, $SF_6$ etching rate [µm/min] of each mask material layers was measured.

Next, using an $O_2$ gas as a plasma-generating gas, ashing was performed. The plasma etching with $O_2$ was performed under the condition that an etching rate of the mask material layer a gets to 1 µm/min, and under this condition, $O_2$ etching rate [µm/min] of each of other mask material layers was measured.

After removing the mask material layer (3b) by the ashing, an ultraviolet light was irradiated from the dicing tape side, thereby to lower an adhesion force of the dicing tape, followed by the picking-up step, chips were picked up.

(Evaluation of Permeation Property)

The above-obtained mask-integrated surface protective tape was laminated on a PET film which was already subjected to an easy adhesion treatment, and after a UV irradiation, only a surface protective tape was peeled. A transmittance of the obtained laminated body composed of the PET film and the mask material layer was measured using a spectral photometer (trade name: UV-1800, manufactured by Shimadzu Corporation). The transmittance of the mask material layer was calculated by subtracting the transmittance of the PET film single body from the above-obtained transmittance.

In this regard, with respect to the etching rate of the mask material layer e of the Sample c1, the etching rate was measured under the same condition as the above-described measurement of etching rate, except that the wafer having the mask material layer prepared in accordance with the following method was used as a wafer having a mask material layer.

—Preparation of Wafer Having Mask Material Layer—

A Si wafer having a mask material layer was prepared by singly coating and drying a mask material composition e on a surface on the side of the patterned surface of the Si wafer to form a mask material layer.

The constitution and the evaluation of the mask-integrated surface protective tapes a to c and e are shown together in the following table.

TABLE 2

|  |  | Sample 1 | Sample 2 | Sample 3 | Sample c1 |
|---|---|---|---|---|---|
| Constitution | Integrated surface protective tape | a | b | c | e |
|  | Substrate film | a | a | a | a |
|  | Adhesive | a | a | a | a |
|  | Mask material | a | b | c | e |
| Evaluation | Mask material layer $SF_6$ etching rate [µm/min] | 0.15 | 0.12 | 0.26 | 0.10 |
|  | $O_2$ etching rate [µm/min] | 1 | 0.90 | 0.76 | 0.35 |
|  | Etching rate ratio ($O_2/SF_6$) | 6.67 | 7.50 | 2.92 | 3.50 |
|  | Permeation property$_{10\ \mu m}$[%] | 78.5 | 71.5 | 65.0 | 80.2 |
|  | Permeation property$_{400-750\ \mu m}$[%] | 97.4 | 97.7 | 96.5 | 99.2 |
|  | Peeling property | A | A | A | C |

In Samples 1 to 3 of the mask-integrated surface protective tapes of the present invention, good results of the peeling property were achieved in any of these samples. Further, in a case where the mask-integrated surface protective tapes of the present invention were used, at the plasma dicing, the mask property was good and the ashing property was also good.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 Semiconductor wafer
2 Patterned face
3 Mask-integrated surface protective tape
3a Surface protective tape
3aa Substrate film
3ab Temporary-adhesive layer
3b Mask material layer
4 Wafer fixing tape
7 Chip
S Surface
B Backing-face
M1 Wafer-grinding apparatus
M2 Pin
M3 Collet F Ring flame
L Laser ($CO_2$ laser)
P1 Plasma of $SF_6$ gas
P2 Plasma of $O_2$ gas

The invention claimed is:

1. A method of producing a semiconductor chip, comprising the following steps (a) to (d):
   (a) a step of, in the state of having laminated a mask-integrated surface protective tape comprising a substrate film, a temporary-adhesive layer provided on the substrate film, and a mask material layer provided on the temporary-adhesive layer, on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;
   (b) a step of integrally peeling both the substrate film and the temporary-adhesive layer from the mask-integrated surface protective tape thereby exposing the mask material layer on top, and thereafter forming an opening by cutting a portion of the mask material layer corresponding to a street of the semiconductor wafer with a laser;
   (c) a plasma dicing step of segmentalizing the semiconductor wafer on the street by a plasma irradiation to singulate it into semiconductor chips; and
   (d) an ashing step of removing the mask material layer by the plasma irradiation.

2. The method of producing the semiconductor chip according to claim 1, wherein at least the temporary-adhesive layer of the mask-integrated surface protective tape is radiation-curable, and the step (b) comprises a step of curing the temporary-adhesive layer by irradiating a radiation thereto, before integrally peeling both the substrate film and the temporary-adhesive layer thereby to expose the mask material layer on top.

3. The method of producing the semiconductor chip according to claim 1, wherein, in the step (c), the plasma irradiation is a fluorine compound-plasma irradiation.

4. The method of producing the semiconductor chip according to claim 1, wherein, in the step (d), the plasma irradiation is an oxygen plasma irradiation.

5. The method of producing the semiconductor chip according to claim 1, which comprises a step (e) of picking up the semiconductor chip from the wafer fixing tape, after the step (d).

6. The method of producing the semiconductor chip according to claim 5, which comprises a step (f) of transiting the picked-up semiconductor chip to a die bonding process, after the step (e).

7. A mask-integrated surface protective tape used in the method of producing the semiconductor chip comprising the following steps (a) to (d),
   wherein the mask-integrated surface protective tape comprises a substrate film, a temporary-adhesive layer and a mask material layer formed on the substrate film in this order, and
   wherein an etching rate of the mask material layer by a $SF_6$ plasma is lower than an etching rate by an oxygen plasma:
   (a) a step of, in the state of having laminated a mask-integrated surface protective tape on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;
   (b) a step of integrally peeling both the substrate film and the temporary-adhesive layer from the mask-integrated surface protective tape thereby exposing the mask material layer on top, and thereafter forming an opening by cutting a portion of the mask material layer corresponding to a street of the semiconductor wafer with a laser;
   (c) a plasma dicing step of segmentalizing the semiconductor wafer on the street by a plasma irradiation to singulate it into semiconductor chips; and
   (d) an ashing step of removing the mask material layer by the plasma irradiation.

8. The mask-integrated surface protective tape according to claim 7, wherein, in the mask material layer, a ratio ($E_{O2}/E_F$) of the etching rate ($E_{O2}$) by the oxygen plasma to the etching rate ($E_F$) by the $SF_6$ plasma is 2.0 or more.

9. The mask-integrated surface protective tape according to claim 7, wherein a light transmittance of the mask material layer at the wavelength of 10 μm is 80% or less, and a visible light transmittance of the mask material layer at the wavelength of 350 nm to 700 nm is 50% or more.

10. The mask-integrated surface protective tape according to claim 7, wherein the mask material layer comprises an acrylate compound having one or two photo-polymerizable carbon-carbon double bonds in the molecule and a content of the acrylate compound is 15% by mass or more.

* * * * *